United States Patent
Hong et al.

(10) Patent No.: US 12,457,864 B2
(45) Date of Patent: Oct. 28, 2025

(54) DISPLAY DEVICE AND DRIVING CIRCUIT

(71) Applicant: LG DISPLAY CO., LTD., Seoul (KR)

(72) Inventors: MooKyoung Hong, Paju-si (KR); DongKyu Yang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 723 days.

(21) Appl. No.: 17/853,874

(22) Filed: Jun. 29, 2022

(65) Prior Publication Data

US 2023/0043902 A1    Feb. 9, 2023

(30) Foreign Application Priority Data

Aug. 3, 2021 (KR) .......................... 10-2021-0101852

(51) Int. Cl.
  *H10K 59/131*   (2023.01)
  *G09G 3/3291*   (2016.01)
  *H10K 59/121*   (2023.01)

(52) U.S. Cl.
  CPC ......... *H10K 59/131* (2023.02); *G09G 3/3291* (2013.01); *H10K 59/1213* (2023.02)

(58) Field of Classification Search
  CPC ............. H10K 59/131; H10K 59/1213; G09G 3/3291; G09G 3/3275; G09G 3/3233; G09G 3/3225; G09G 2300/0452; G09G 2300/0842; G09G 2320/0295; G09G 2320/045; G09G 2320/04; G09G 2310/08
  See application file for complete search history.

(56) References Cited

U.S. PATENT DOCUMENTS

| 10,541,286 B2 | 1/2020 | Park et al. |
| 2018/0083078 A1 | 3/2018 | Park et al. |
| 2021/0104195 A1 | 4/2021 | Choi et al. |

FOREIGN PATENT DOCUMENTS

| CN | 107863071 A | 3/2018 |
| EP | 3300066 A1 | 3/2018 |
| EP | 3800629 A1 | 4/2021 |
| KR | 10-2017-0027292 A | 3/2017 |
| KR | 10-2017-0064142 A | 6/2017 |

(Continued)

OTHER PUBLICATIONS

Machine translation of KR 20170027292 A (Year: 2017).*

(Continued)

*Primary Examiner* — Elmito Breval
*Assistant Examiner* — Jose M Diaz
(74) *Attorney, Agent, or Firm* — Morgan, Lewis & Bockius LLP

(57) ABSTRACT

The present disclosure provides a display device and a driving circuit. In the display device, a first subpixel is connected to a first data line and a first reference voltage line, and includes an emitting device and a driving transistor; and a second subpixel is connected to a second data line and a second reference voltage line, and includes an emitting device and a driving transistor. The driving time of the first subpixel includes a first initialization time in which a reference voltage is applied to the first reference voltage line and a first tracking time in which a voltage of the first reference voltage line increases from the reference voltage and then is saturated. Sensing times for subpixels having different channel sizes are reduced.

17 Claims, 22 Drawing Sheets

(56) References Cited

FOREIGN PATENT DOCUMENTS

KR  10-2017-0064162 A  6/2017
KR  10-2021-0001168 A  1/2021

OTHER PUBLICATIONS

Extended European search report issued in European Patent Application No. 22180276.2 dated Nov. 16, 2022.
Notice of Allowance issued on Oct. 16, 2024 for Chinese Patent Application No. 202210722687.4 with English translation.
Office Action issued on Apr. 22, 2024 for Chinese Patent Application No. 202210722687.4.
Office Action issued on Nov. 23, 2024 for Korean Patent Application No. 10-2021-0101852.

* cited by examiner

FIG.4
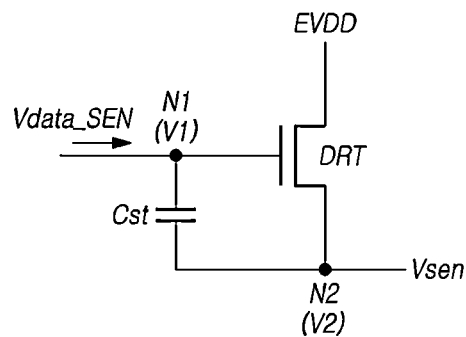
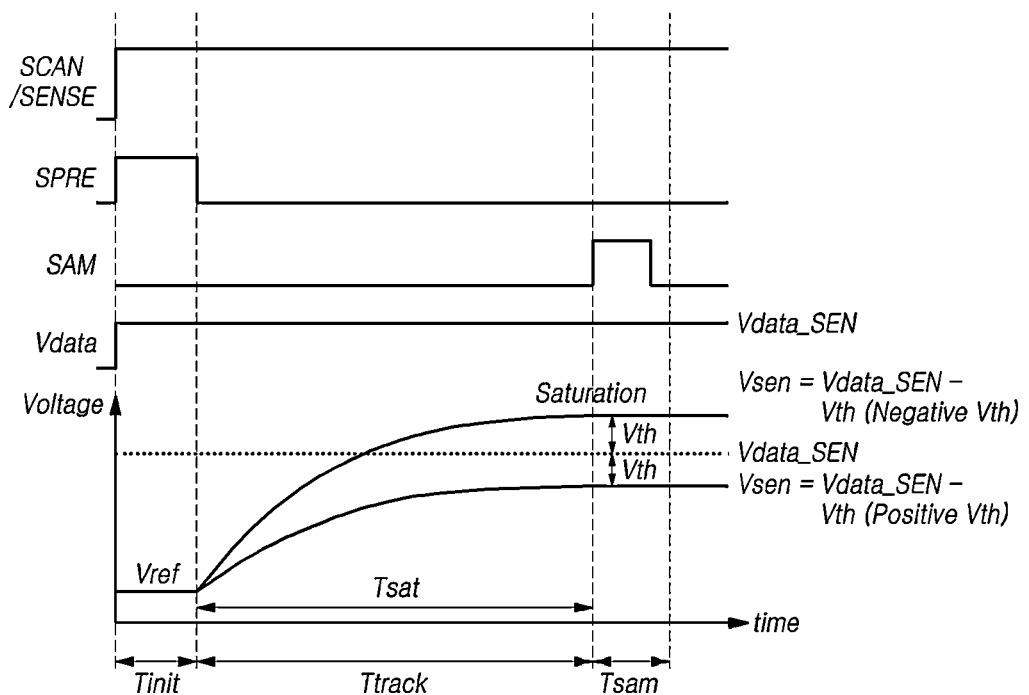

FIG.10A
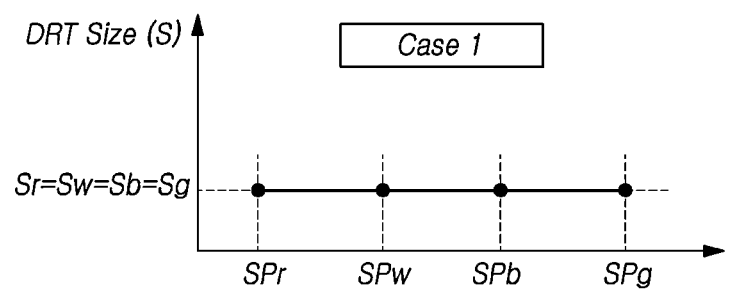
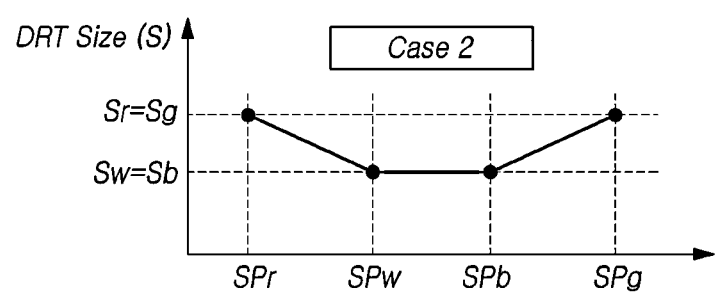
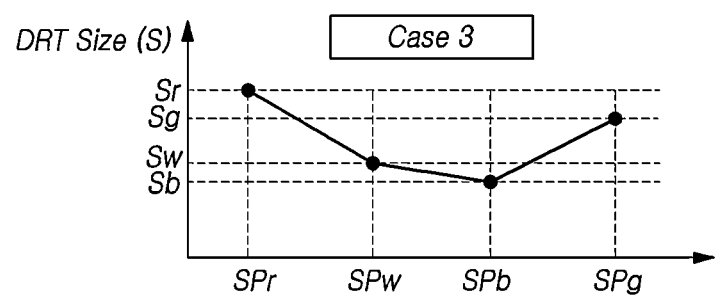

FIG.10B
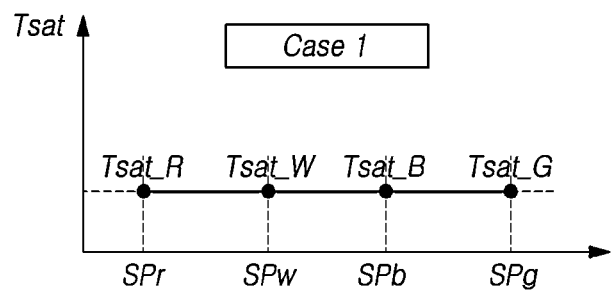
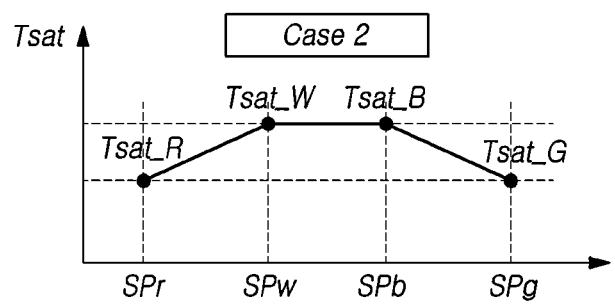
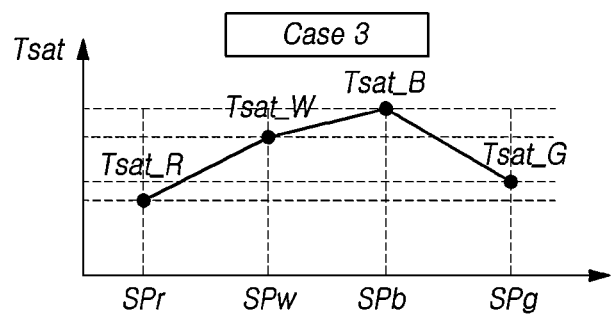

• Saturation Point

DISPLAY DEVICE AND DRIVING CIRCUIT

CROSS REFERENCE TO RELATED APPLICATION

This application claims priority from Korean Patent Application No. 10-2021-0101852, filed on Aug. 3, 2021, which is hereby incorporated by reference for all purposes as if fully set forth herein.

BACKGROUND

Technical Field

Embodiments relate to a display device and a driving circuit.

Discussion of the Related Art

Among display devices currently being developed, there is a self-emissive display device including a display panel capable of emitting light by itself. The display panel of such a self-emissive display device may include subpixels each comprised of an emitting device, a driving transistor for driving the emitting device, and the like in order to emit light by itself.

Each of circuit devices, such as driving transistors and emitting devices, disposed in the display panel of the self-emissive display device has unique characteristics. For example, unique characteristics of each driving transistor include a threshold voltage, mobility, and the like. Unique characteristics of each emitting device include a threshold voltage and the like.

Circuit devices in each subpixel may degrade over driving time, and thus the unique characteristics thereof may change. Since the subpixels may have different driving times, characteristics of a circuit device in each subpixel may have different degrees of changes from those of a circuit device in another subpixel. Thus, characteristic deviation may occur among the subpixels over the driving time, thereby resulting in luminance deviation among the subpixels. The luminance deviation among the subpixels may be a major factor for reducing brightness uniformity of a display device, thereby deteriorating the quality of images.

Accordingly, a variety of compensation methods for compensating for the luminance deviation among the subpixels have been developed. Such compensation methods are required to sense characteristics of circuit devices included in respective subpixels in order to review the luminance deviation among the subpixels. However, there is a real problem in that to sense characteristics for circuit devices in each of subpixels requires a significantly long time. Accordingly, the efficiency of the display device regarding operation and use is reduced, which is problematic.

SUMMARY

In the display field, there have been problems in that sensing driving of subpixels in a display panel requires a long sensing time and thus the efficiency of the display device regarding operation and use is reduced. In this regard, the inventors of the present application have invented a display device and a driving circuit able to reduce sensing time without reducing sensing accuracy.

In addition, the inventors of the present application have discovered that the sensing time deviation among the subpixels in the display device may be caused by the size deviation among transistors in the subpixels through extensive research and experiments. As a result, the inventors have invented a display device and a driving circuit able to reduce sensing times while reducing the sensing time deviation among the subpixels.

Accordingly, embodiments of the present disclosure are directed to a display device and a driving circuit that substantially obviate one or more of the problems due to limitations and disadvantages of the related art.

An aspect of the present disclosure is to provide a display device and a driving circuit able to reduce sensing time for subpixels having different channel sizes.

Another aspect of the present disclosure is to provide a display device and a driving circuit able to improve compensation efficiency by simultaneously stopping sensing driving of subpixels having different sensing times.

Another aspect of the present disclosure is to provide a display device and a driving circuit having a sensing time reducing function applicable even in double-rate driving.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises: a first data line and a second data line; a first reference voltage line and a second reference voltage line; a first subpixel connected to the first data line and the first reference voltage line, and including an emitting device and a driving transistor; and a second subpixel connected to the second data line and the second reference voltage line, and including an emitting device and a driving transistor.

The driving time of the first subpixel may include a first initialization time in which a reference voltage is applied to the first reference voltage line and a first tracking time in which a voltage of the first reference voltage line increases from the reference voltage and then is saturated.

The driving time of the second subpixel may include a second initialization time in which the reference voltage is applied to the second reference voltage line and a second tracking time in which a voltage of the second reference voltage line increases from the reference voltage and then is saturated.

The length of the first tracking time may be longer than the length of the second tracking time.

The start point of the first tracking time may be earlier than the start point of the second tracking time or the end point of the first tracking time may later than an end point of the second tracking time.

The channel size of the driving transistor included in the first subpixel may be equal to or smaller than the channel size of the driving transistor included in the second subpixel.

The start point of the first initialization time may earlier than the start point of the second initialization time. The end point of the first initialization time may earlier than the end point of the second initialization time.

According to initialization split control, the length of the first tracking time may longer than the length of the second tracking time. The start point of the first tracking time may earlier than the start point of the second tracking time. The end point of the first tracking time may the same as an end point of the second tracking time.

According to another initialization split control, the start point of the first initialization time may be the same as the start point of the second initialization time. The end point of the first initialization time may be earlier than the end point of the second initialization time.

According to initialization split control, the length of the first tracking time may be longer than the length of the second tracking time. The start point of the first tracking time may be earlier than the start point of the second tracking time. The end point of the first tracking time may be the same as the end point of the second tracking time.

According to initialization split control, the length of the first tracking time may be longer than the length of the second tracking time. The start point of the first tracking time may be the same as the start point of the second tracking time. The end point of the first tracking time may be later than the end point of the second tracking time.

The display device may further include: a measuring circuit measuring a voltage of each of the first reference voltage line and the second reference voltage line; a first power switch switching a connection between the first reference voltage line and a reference voltage application node; a first sampling switch switching a connection between the first reference voltage line and the measuring circuit; a second power switch switching a connection between the second reference voltage line and the reference voltage application node; and a second sampling switch switching a connection between the second reference voltage line and the measuring circuit.

The turn-on point in time of the first power switch may be earlier than the turn-on point in time of the second power switch. The turn-off point in time of the first power switch may earlier than the turn-off point in time the second power switch. The turn-on point in time of the first sampling switch may be the same as the turn-on point in time of the second sampling switch.

The turn-on point in time of the first power switch be the same as the turn-on point in time of the second power switch. The turn-off point in time of the first power switch may be earlier than the turn-off point in time of the second power switch. The turn-on point in time of the first sampling switch may be the same as the turn-on point in time of the second sampling switch The turn-on point in time of the first sampling switch may be later than the turn-on point in time of the second sampling switch. The turn-off point in time of the first power switch may be the same as the turn-off point in time of the second power switch.

In another aspect, a driving circuit comprises: a first data channel terminal electrically connected to a first data line; a second data channel terminal electrically connected to a second data line; a first sensing channel terminal electrically connected to a first reference voltage line; a second sensing channel terminal electrically connected to a second reference voltage line; and a data signal provider outputting a first data signal to the first data channel terminal and a second data signal to the second data channel terminal.

The point in time at which a voltage of the first sensing channel terminal starts to increase from a reference voltage may be earlier than a point in time at which a voltage of the second sensing channel terminal starts to increase from the reference voltage, or the point in time at which the voltage of the first sensing channel terminal may be saturated is later than a point in time at which the voltage of the second sensing channel terminal is saturated.

The driving circuit may further include: a measuring circuit measuring a voltage of each of the first reference voltage line and the second reference voltage line; a first power switch switching a connection between the first reference voltage line and a reference voltage application node; a first sampling switch switching a connection between the first reference voltage line and the measuring circuit; a second power switch switching a connection between the second reference voltage line and the reference voltage application node; and a second sampling switch switching a connection between the second reference voltage line and the measuring circuit.

According to embodiments, the display device and the driving circuit can reduce sensing times.

According to embodiments, the display device and the driving circuit can reduce sensing time for subpixels having different channel sizes.

According to embodiments, the display device and the driving circuit can improve compensation efficiency by simultaneously stopping sensing driving of subpixels having different sensing times.

According to embodiments, the display device and the driving circuit have a sensing time reducing function applicable even in double-rate driving.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles. In the drawings:

FIG. 4 is a diagram illustrating sensing driving of the display device according to embodiments;

FIG. 10A illustrates graphs comparing the sizes S of driving transistors included in subpixels for 4 colors in the display device according to embodiments;

FIG. 10B illustrates graphs comparing saturation times required in the sensing driving of the subpixels for 4 colors in the display device according to embodiments;

DETAILED DESCRIPTION

Figure 1:
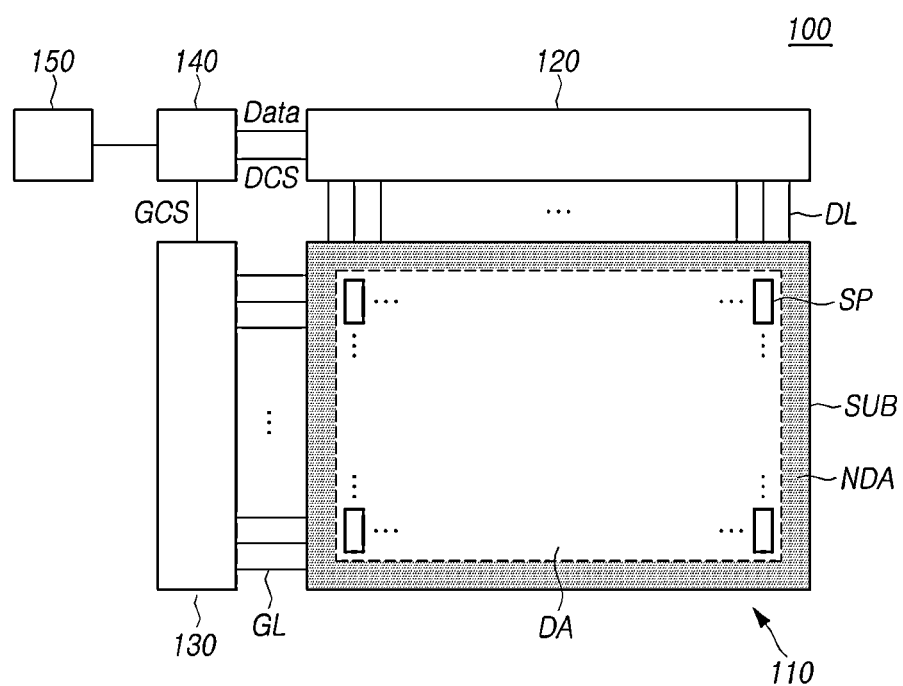
FIG. 1 is a diagram illustrating a system configuration of a display device according to embodiments.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting" "made up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, a variety of embodiments will be described with reference to the accompanying drawings.

FIG. 1 is a diagram illustrating a system configuration of a display device 100 according to embodiments.

Referring to FIG. 1, a display driving system of the display device 100 according to embodiments may include a display panel 110 and a driving circuit driving the display panel 110.

The display panel 110 may include a display area DA on which images are displayed and a non-display area NDA on which images are not displayed. The display panel 110 may include a plurality of subpixels SP disposed on a substrate SUB to display images. For example, the plurality of subpixels SP may be disposed in the display area DA. In some cases, at least one subpixel SP may be disposed in the non-display area NDA. The at least one subpixel SP disposed in the non-display area NDA is also referred to as a dummy subpixel.

The display panel 110 may include a plurality of signal lines disposed on the substrate SUB to drive the plurality of subpixels SP. For example, the plurality of signal lines may include a plurality of data lines DL and a plurality of gate lines GL. The signal lines may further include other signal lines, in addition to the plurality of data lines DL and the plurality of gate lines GL, depending on the structure of the subpixels SP. For example, the other signals lines may include driving voltage lines, reference voltage lines, and the like.

The plurality of data lines DL may intersect the plurality of gate lines GL. Each of the plurality of data lines DL may be arranged to extend in a first direction. Each of the plurality of gate lines GL may be arranged to extend in a second direction. Here, the first direction may be a column direction, whereas the second direction may be a row direction. The column direction and the row direction used herein are relative terms. In an example, the column direction may be a vertical direction, whereas the row direction may be a horizontal direction. In another example, the column direction may be a horizontal direction, whereas the row direction may be a vertical direction.

The driving circuit may include a data driving circuit 120 to drive the plurality of data lines DL and a gate driving circuit 130 to drive the plurality of gate lines GL. The driving circuit may further include a controller 140 to drive the data driving circuit 120 and the gate driving circuit 130.

The data driving circuit 120 is a circuit to drive the plurality of data lines DL. The data driving circuit 120 may output data signals (also referred to as data voltages) corresponding to image signals to the plurality of data lines DL. The gate driving circuit 130 is a circuit to drive the plurality of gate lines GL. The gate driving circuit 130 may generate gate signals and output the gate signals to the plurality of gate lines GL.

The controller 140 may start scanning at points in time defined for respective frames and control the data driving at appropriate times in response to the scanning. The controller 140 may convert image data input from an external source into image data having a data signal format readable by the data driving circuit 120, and transfer the image data to the data driving circuit 120.

The controller 140 may receive display drive control signals together with the input image data from an external host system 150. For example, the display drive control signals may include a vertical synchronization signal Vsync, a horizontal synchronization signal Hsync, an input data enable signal DE, a clock signal, and the like.

The controller 140 may generate data drive control signals DCS and gate drive control signals GCS on the basis of the display drive control signals input from the host system 150. The controller 140 may control drive operations and drive timing of the data driving circuit 120 by transferring the data drive control signals to the data driving circuit 120. The controller 140 may control drive operations and drive timing of the gate driving circuit 130 by transferring the gate drive control signals GCS to the gate driving circuit 130.

The data driving circuit 120 may include one or more source driver integrated circuits (SDICs). Each of the SDICs may include a shift register, a latch circuit, a digital-to-analog converter (DAC), an output buffer, and the like. In some cases, each of the SDICs may further include an analog-to-digital converter (ADC).

For example, each of the SDICs may be connected to the display panel 110 by a tape-automated bonding (TAB) method, connected to a bonding pad of the display panel 110 by a chip-on-glass (COG) method or a chip on panel (COP) method, or implemented using a chip-on-film (COF) structure connected to the display panel 110.

The gate driving circuit 130 may output a gate signal having a turn-on level voltage or a gate signal having a turn-off level voltage under the control of the controller 140. The gate driving circuit 130 may sequentially drive the plurality of gate lines GL by sequentially transferring the gate signal having a turn-on level voltage to the plurality of gate lines GL.

The gate driving circuit 130 may be connected to the display panel 110 by a TAB method, connected to a bonding pad of the display panel 110 by a COG method or a COP method, or connected to the display panel 110 by a COF method. Alternatively, the gate driving circuit 130 may be formed in the non-display area NDA of the display panel 110 by a gate-in-panel (GIP) method. The gate driving circuit 130 may be disposed on the substrate SUB or connected to the substrate SUB. That is, when the gate driving circuit 130 is a GIP type, the gate driving circuit 130 may be disposed in the non-display area NDA of the substrate SUB. When the gate driving circuit 130 is a COG type, a COF type, or the like, the gate driving circuit 130 may be connected to the substrate SUB.

In addition, at least one driving circuit of the data driving circuit 120 and the gate driving circuit 130 may be disposed in the display area DA. For example, at least one driving circuit of the data driving circuit 120 and the gate driving circuit 130 may be disposed to not overlap the subpixels SP or to overlap some or all of the subpixels SP.

The data driving circuit 120 may be connected to one side (e.g., a top side or a bottom side) of the display panel 110. The data driving circuit 120 may be connected to both sides (e.g., both the top side and the bottom side) of the display panel 110 or connected to two or more sides among four sides of the of the display panel 110, depending on the driving method, the design of the display panel, or the like.

The gate driving circuit 130 may be connected to one side (e.g., a left side or a right side) of the display panel 110. The gate driving circuit 130 may be connected to both sides (e.g., both the left side and the right side) of the display panel 110 or connected to two or more sides among four sides of the of the display panel 110, depending on the driving method, the design of the display panel, or the like.

The controller 140 may be provided as a component separate from the data driving circuit 120 or may be combined with the data driving circuit 120 to form an integrated circuit (IC). The controller 140 may be a timing controller typically used in the display field, may be a control device including a timing controller and able to perform other control functions, may be a control device different from the timing controller, or may be a circuit in a control device. The controller 140 may be implemented as a variety of circuits or electronic components, such as an integrated circuit (IC), a field programmable gate array (FPGA), an application specific integrated circuit (ASIC), a processor, or the like.

The controller 140 may be mounted on a printed circuit board (PCB), a flexible printed circuit (FPC), or the like, and electrically connected to the data driving circuit 120 and the gate driving circuit 130 through the PCB, the FPC, or the like. The controller 140 may transmit signals to or receive signals from the data driving circuit 120 through at least one predetermined interface. Here, for example, the interface may include a low-voltage differential signaling (LVDS) interface, an eValid programmatic interface (EPI), a serial peripheral (SP) interface, and the like.

The display device 100 according to embodiments may be a self-emissive display device in which the display panel 110 emits light by itself. When the display device 100 according to embodiments is a self-emissive display device, each of the plurality of subpixels SP may include an emitting device (ED). For example, the display device 100 according to embodiments may be an organic light-emitting display device in which the emitting device is implemented as an organic light-emitting diode (OLED). In another example, the display device 100 according to embodiments may be an inorganic light-emitting display device in which the emitting device is implemented as an OLED based on an inorganic material. In another example, the display device 100 according to embodiments may be a quantum dot display device in which the emitting device is implemented as a quantum dot that is a self-emissive semiconductor crystal.

Figure 2:
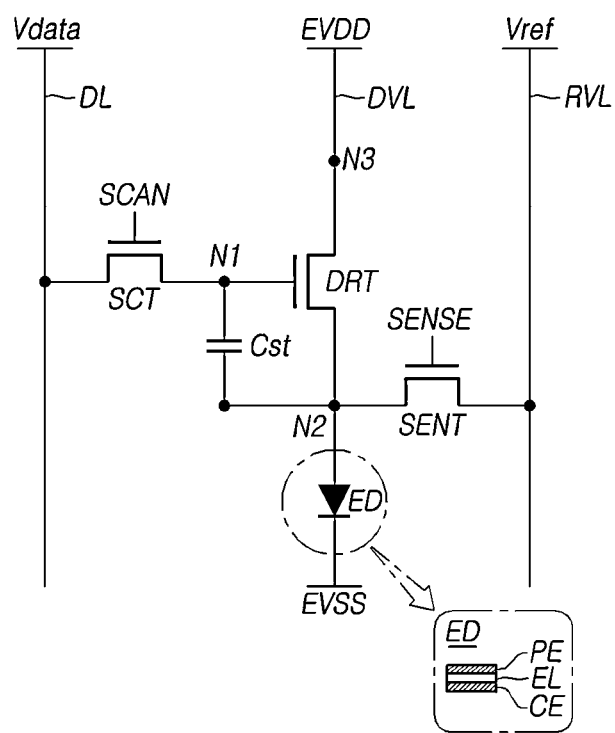
FIG. 2 illustrates an equivalent circuit of a subpixel SP in the display device according to embodiments.

FIG. 2 illustrates an equivalent circuit of a subpixel SP in the display device 100 according to embodiments.

Referring to FIG. 2, in the display device 100 according to embodiments, each of the subpixels SP includes an emitting device ED, a driving transistor DRT supplying a drive current to the emitting device ED to drive the emitting device ED, a scan transistor SCT transferring a data signal Vdata to the driving transistor DRT, a storage capacitor Cst maintaining a voltage for a predetermined period, and the like.

The scan transistor SCT may control the voltage state of a first node N1 of the driving transistor DRT to control the driving state of the subpixel SP. Each subpixel SP may further include a sensing transistor SENT configured to control the voltage state of a second node N2 of the driving transistor DRT in order to control the driving state of the subpixel SP.

The subpixel SP illustrated in FIG. 2 includes three transistors DRT, SCT, and SENT and one capacitor Cst to drive the emitting device ED, and thus is referred to as having a 3-transistor 1-capacitor (3T1C) structure.

The emitting device ED may include a pixel electrode PE, a common electrode CE, and an emissive layer EL positioned between the pixel electrode PE and the common electrode CE. The pixel electrode PE of the emitting device ED may be an anode or a cathode. The common electrode CE may be a cathode or an anode. A base voltage EVSS corresponding to a common voltage may be applied to the common electrode CE of the emitting device ED. Here, the base voltage EVSS may be, for example, a ground voltage or a voltage similar to the ground voltage. For example, the emitting device ED may be an organic light-emitting diode (OLED), a light-emitting diode (LED) based on an inorganic material, a quantum dot emitting device, or the like.

The driving transistor DRT may be a transistor to drive the emitting device ED, and include the first node N1, the second node N2, and a third node N3. The first node N1 of the driving transistor DRT may be a node corresponding to a gate node, and be electrically connected to a source node or a drain node of the scan transistor SCT. The second node N2 of the driving transistor DRT may be a source node or a drain node, be electrically connected to a source node or a drain node of the sensing transistor SENT, and be electrically connected to the pixel electrode PE of the emitting device ED. The third node N3 of the driving transistor DRT may be a drain node or a source node, and be electrically connected to a driving voltage line DVL through which a driving voltage EVDD is supplied. Hereinafter, for the sake of brevity, the second node N2 of the driving transistor DRT will be described as being a source node, whereas the third node N3 will be described as being a drain node.

The scan transistor SCT may be connected to a data line DL and the first node N1 of the driving transistor DRT. The scan transistor SCT may control the connection between the first node N1 of the driving transistor DRT and a corresponding data line DL among the plurality of data lines DL in response to a scan signal SCAN transferred through a corresponding scan signal line SCL among a plurality of scan signal lines SCL, i.e., a type of gate lines GL.

The drain node or the source node of the scan transistor SCT may be electrically connected to the corresponding data line DL. The source node or the drain node of the scan transistor SCT may be electrically connected to the first node N1 of the driving transistor DRT. The gate node of the scan transistor SCT may be electrically connected to the scan signal line SCL, i.e., a type of gate line GL, to receive the scan signal SCAN applied through the scan signal line SCL.

The scan transistor SCT may be turned on by the scan signal SCAN having a turn-on level voltage to transfer the data signal Vdata transferred through the corresponding data line DL to the first node N1 of the driving transistor DRT. The scan transistor SCT is turned on by the scan signal SCAN having a turn-on level voltage and turned off by the scan signal SCAN having a turn-off level voltage. Here, when the scan transistor SCT is an N-type transistor, the turn-on level voltage may be a high level voltage, and the turn-off level voltage may be a low level voltage. When the scan transistor SCT is a P-type transistor, the turn-on level voltage may be a low level voltage, and the turn-off level voltage may be a high level voltage.

The sensing transistor SENT may be connected to the second node N2 of the driving transistor DRT and a reference voltage line RVL. The sensing transistor SENT may control the connection between the second node N2 of the driving transistor DRT electrically connected to the pixel electrode PE of the emitting device ED and a corresponding reference voltage line RVL among a plurality of reference voltage lines RVL in response to a sensing signal SENSE transferred through a corresponding sensing signal line SENL among a plurality of sensing signal lines SENL, i.e., a type of gate line GL.

The drain node or the source node of the sensing transistor SENT may be electrically connected to the reference voltage line RVL. The source node or the drain node of the sensing transistor SENT may be electrically connected to the second node N2 of the driving transistor DRT, and electrically connected to the pixel electrode PE of the emitting device ED. The gate node of the sensing transistor SENT may be electrically connected to the sensing signal line SENL, i.e., a type of gate line GL, to receive the sensing signal SENSE applied therethrough.

The sensing transistor SENT may be turned on to apply a reverence voltage Vref supplied through the reference voltage line RVL to the second node N2 of the driving transistor DRT. The sensing transistor SENT is turned on by the sensing signal SENSE having a turn-on level voltage, and turned off by the sensing signal SENSE having a turn-off level voltage. When the sensing transistor SENT is an N-type transistor, the turn-on level voltage may be a high level voltage, and the turn-off level voltage may be a low level voltage. When the sensing transistor SENT is a P-type transistor, the turn-on level voltage may be a low level voltage, and the turn-off level voltage may be a high level voltage.

The storage capacitor Cst may be electrically connected to the first node N1 and the second node N2 of the driving transistor DRT so as to maintain the data signal Vdata corresponding to an image signal voltage or a voltage corresponding to the data signal Vdata during a one-frame period.

The storage capacitor Cst may be an external capacitor intentionally designed to be provided externally of the driving transistor DRT, rather than a parasitic capacitor (e.g. Cgs or Cgd), i.e., an internal capacitor, present between the gate node and the source node (or the drain node) of the driving transistor DRT.

Each of the driving transistor DRT, the scan transistor SCT, and the sensing transistor SENT may be an N-type transistor or a P-type transistor. All of the driving transistor DRT, the scan transistor SCT, and the sensing transistor SENT may be N-type transistors or P-type transistors. At least one of the driving transistor DRT, the scan transistor SCT, and the sensing transistor SENT may an N-type transistor (or a P-type transistor), and the remaining transistors may be P-type transistors (or N-type transistors).

The scan signal line SCL and the sensing signal line SENL may be different gate lines GL. In this case, the scan signal SCAN and the sensing signal SENSE may be separate gate signals, and the on-off timing of the scan transistor SCT and the on-off timing of the sensing transistor SENT in a single subpixel SP may be independent of each other. That is, the on-off timing of the scan transistor SCT and the on-off timing of the sensing transistor SENT in the single subpixel SP may be the same or different. When the scan signal line SCL and the sensing signal line SENL are different gate lines GL, the gate node of the scan transistor SCT and the gate node of the sensing transistor SENT in the subpixel SP may be controlled independently of each other. In this case, the subpixel SP is referred to as having a 2-scan structure.

Alternatively, the scan signal line SCL and the sensing signal line SENL may be the same gate line GL. That is, the gate node of the scan transistor SCT and the gate node of the sensing transistor SENT in the single subpixel SP may be connected to a single gate line GL. In this case, the scan signal SCAN and the sensing signal SENSE may be the same gate signal, and the on-off timing of the scan transistor SCT and the on-off timing of the sensing transistor SENT in the single subpixel SP may be the same. When the scan signal line SCL and the sensing signal line SENL are the same gate line GL, the gate node of the scan transistor SCT and the gate node of the sensing transistor SENT in the subpixel SP may be controlled in common. Here, the subpixel SP is referred to as having a 1-scan structure.

The reference voltage line RVL may be disposed for every single subpixel column.

Alternatively, the reference voltage line RVL may be disposed for every two or more subpixel columns. When the reference voltage line RVL is disposed for every two or more subpixel columns, two or more subpixels SP may be supplied with the reference voltage Vref through a single reference voltage line RVL. For example, each reference voltage line RVL may be disposed for every 4 subpixel columns. That is, a single reference voltage line RVL may be shared by subpixels SP in 4 subpixel columns.

The driving voltage line DVL may be disposed for every subpixel column.

Alternatively, the driving voltage line DVL may be disposed for every two or more subpixel columns. When the driving voltage line DVL are disposed for every two or more subpixel columns, two or more subpixels SP may be supplied with the driving voltage EVDD through a single driving voltage line DVL. For example, each driving voltage line DVL may disposed for every 4 subpixel columns. That is, a single driving voltage line DVL may be shared by subpixels SP in 4 subpixel columns.

The 3T1C structure of the subpixel SP illustrated in FIG. 2 is only an example given for explanation. Rather, the subpixel structure may further include one or more transistors, or in some cases, one or more capacitors. In addition, all of the plurality of subpixels may have the same structure, or some of the plurality of subpixels may have a different structure.

In addition, the display device 100 according to embodiments may have a top emission structure or a bottom emission structure.

In addition, circuit devices, such as the emitting device ED and the driving transistor DRT, included in each of the plurality of subpixels SP may have unique characteristics. For example, each emitting device ED may have unique characteristics, such as a threshold voltage. Each driving transistor DRT may have unique characteristics, such as a threshold voltage and mobility.

The characteristics of the emitting device ED may change with increases in the driving time of the emitting device ED. The characteristics of the driving transistor DRT may change with increases in the driving time of the driving transistor DRT.

The plurality of subpixels SP may have different driving times. Thus, changes in the characteristics of the emitting device ED in each of the plurality of subpixels SP may be different from those of the emitting devices ED in other subpixels SP. Thus, characteristic deviation may occur among the emitting devices ED.

The characteristic deviation among the emitting devices ED or the driving transistors DRT may lead to luminance deviation among the subpixels SP. Consequently, the luminance uniformity of the display panel 110 may be reduced, thereby degrading the image quality of the display panel 110.

In this regard, the display device 100 according to embodiments may provide a compensation function to reduce the characteristic deviation among the emitting devices ED or the driving transistors DRT, and may include a compensation circuit for this purpose. Hereinafter, the compensation function and the compensation circuit will be described with reference to FIG. 3.

Figure 3:
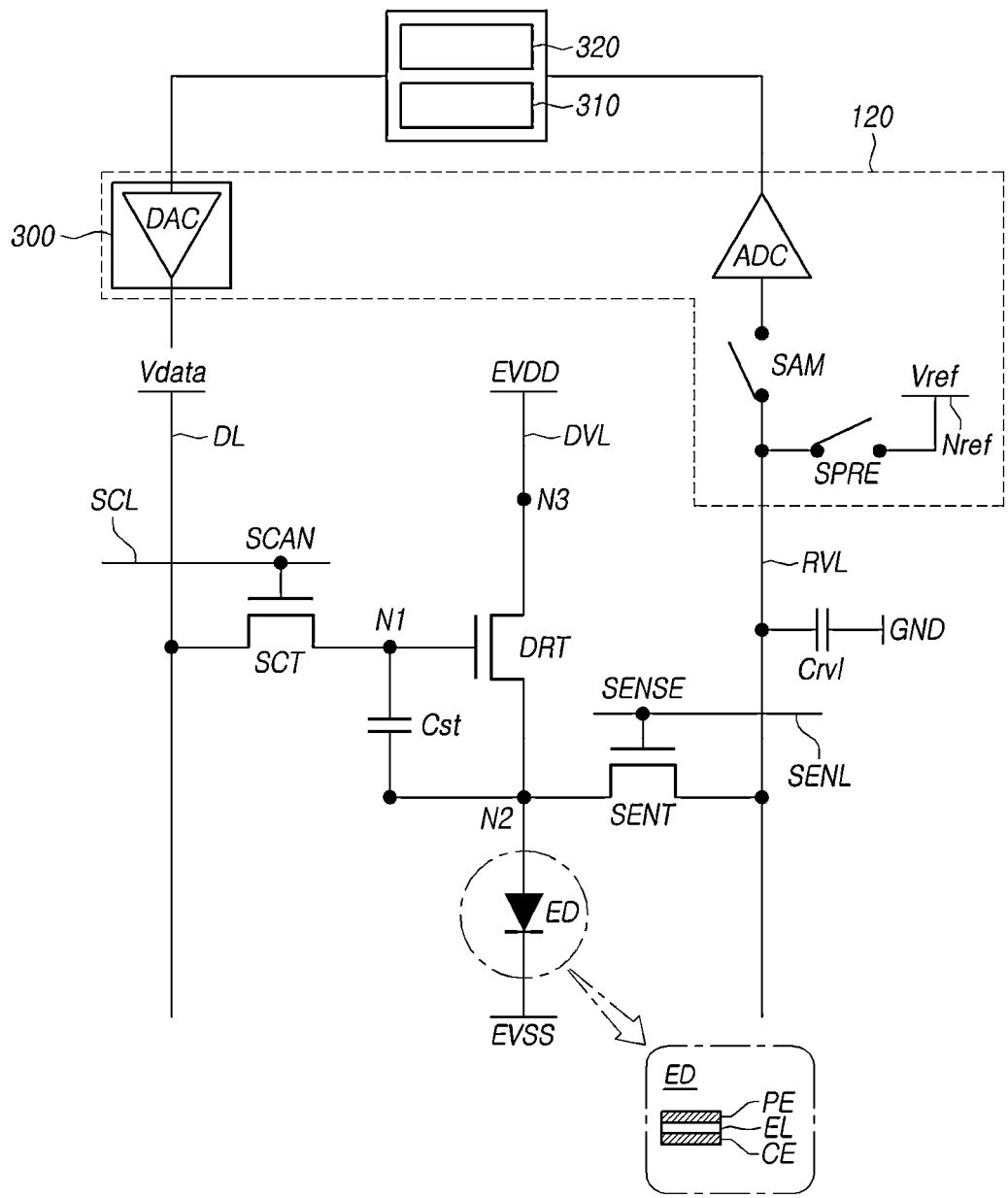
FIG. 3 illustrates a compensation circuit of the display device according to embodiments.

FIG. 3 illustrates a compensation circuit of the display device 100 according to embodiments.

The compensation circuit of the display device 100 according to embodiments is a circuit able to sense and compensate for characteristics of circuit devices in each subpixel SP.

Referring to FIG. 3, the compensation circuit may essentially include the subpixel SP, and may also include a power switch SPRE, a sampling switch SAM, an analog-to-digital converter ADC, a compensator 320, and the like to control the operation of the subpixel SP and sense and compensate for characteristics of the subpixel SP (e.g., the threshold voltage of the emitting device ED and the threshold voltage, mobility, and the like of the driving transistor DRT).

The power switch SPRE may control the connection between the reference voltage line RVL and a reference voltage application node Nref. The reference voltage Vref output from the power supply may be supplied to the reference voltage application node Nref, and reference voltage Vref supplied to the reference voltage application node Nref may be applied to the reference voltage line RVL through the power switch SPRE.

The sampling switch SAM may control the connection between the analog-to-digital converter ADC and the reference voltage line RVL. When connected to the reference voltage line RVL by the sampling switch SAM, the analog-to-digital converter ADC may convert a voltage of the connected reference voltage line RVL (corresponding to an analogue value) into a sensing value corresponding to a digital value.

A line capacitor Crvl may be formed between the reference voltage line RVL and the ground GND. A voltage of the reference voltage line RVL may correspond to a state of charge of the line capacitor Crvl.

The analog-to-digital converter ADC may provide sensing data including a sensing value to the compensator 320. The compensator 320 may obtain characteristic values of the emitting device ED or the driving transistor DRT of the corresponding subpixel SP on the basis of the sensing data, calculate a compensation value, and store the compensation value in a memory 310.

For example, the compensation value is information for reducing characteristic deviation among the emitting devices ED or the driving transistors DRT. The compensation value may include offset and gain values for changing data.

The controller 140 may change image data using the compensation value stored in the memory 310, and transfer the changed image data to the data driving circuit 120.

The data driving circuit 120 may include a data signal provider 300 to output data signals to the plurality of data lines DL. The data signal provider 300 may include a latch circuit, a digital-to-analog converter DAC, and the like.

The data signal provider 300 of the data driving circuit 120 may output a data signal Vdata that is an analogue value by converting the image data, changed on the basis of the compensation value, into the data signal Vdata using the digital-to-analog converter DAC. Consequently, the compensation may be realized.

Referring to FIG. 3, the analog-to-digital converter ADC, the power switch SPRE, and the sampling switch SAM may be included in the data driving circuit 120. The compensator 320 may be included in the controller 140.

Hereinafter, a sensing driving method will be described in more detail with reference to FIG. 4. The sensing driving method for sensing the threshold voltage of the driving transistor DRT will be described as an example.

FIG. 4 is a diagram illustrating the sensing driving of the display device 100 according to embodiments.

Referring to FIG. 4, a sensing driving time of the display device 100 according to embodiments may include an initialization time Tinit, a tracking time Ttrack, and a sampling time Tsam.

Referring to FIG. 4, the initialization time Tinit of the sensing driving time is a time period in which the first node N1 and the second node N2 of the driving transistor DRT are initialized. During the initialization time Tinit, a voltage V1 on the first node N1 of the driving transistor DRT may be initialized as a sensing driving data signal Vdata_SEN, and a voltage V2 on the second node N2 of the driving transistor DRT may be initialized as a sensing driving reference voltage Vref.

The sensing driving data signal Vdata_SEN is a data signal having a specific voltage value for sensing driving, and typically, may have a constant voltage value during a single sensing driving time.

During the initialization time Tinit, the scan transistor SCT and the sensing transistor SENT may be turned on, and the power switch SPRE may be turned on.

Referring to FIG. 4, the tracking time Ttrac of the sensing driving time is a time period in which a threshold voltage Vth of the driving transistor DRT or a voltage V2 on the second node N2 of the driving transistor DRT reflecting a change in the threshold voltage Vth is tracked.

During the tracking time Ttrack, the power switch SPRE may be turned off or the sensing transistor SENT may be turned off. Thus, the second node N2 of the driving transistor DRT may be in a state in which the reference voltage Vref is no longer applied to the second node N2. That is, the second node N2 of the driving transistor DRT may be in an electrically floated state.

In other words, during the tracking time Ttrack, the first node N1 of the driving transistor DRT has no undesired voltage fluctuation, due to the sensing driving data signal Vdata_SEN applied thereto. However, in this state, the second node N2 of the driving transistor DRT may be in an electrically floated state. Thus, during the tracking time Ttrack, the voltage V2 on the second node N2 of the driving transistor DRT may fluctuate.

During the tracking time Ttrack, until the voltage V2 on the second node N2 of the driving transistor DRT reflects the threshold voltage Vth of the driving transistor DRT, the voltage V2 on the threshold voltage Vth of the driving transistor DRT may be increased.

During the initialization time Tinit, a voltage difference Vdata_SEN−Vref between the first node N1 and the second node N2 may be equal to or higher than the threshold voltage Vth of the driving transistor DRT (Vdata_SEN−Vref≥Vth). Thus, when the tracking time Ttrack starts, the driving transistor DRT is in a turned-on state and allows a current to flow therethrough. Consequently, when the tracking time Ttrack starts, the voltage V2 on the second node N2 driving transistor DRT may be increased.

During the tracking time Ttrack, the voltage V2 on the second node N2 of the driving transistor DRT may increase and, after a predetermined time has passed, be saturated instead of continuing to increase. That is, the increment of the voltage on the second node N2 of the driving transistor DRT decreases toward the end of the tracking time Ttrack, so that the voltage V2 on the second node N2 of the driving transistor DRT may be saturated.

The saturated voltage V2 on the second node N2 of the driving transistor DRT may correspond to a difference Vdata_SEN−Vth between the data signal Vdata_SEN and the threshold voltage Vth or a difference Vdata_SEN−ΔVth between the data signal Vdata_SEN and a threshold voltage deviation ΔVth. Here, the threshold voltage Vth may be a negative threshold voltage Negative Vth having a negative value or a positive threshold voltage Positive Vth having a positive value.

When the voltage V2 on the second node N2 of the driving transistor DRT is saturated, the sampling time Tsam may be started. The sampling time Tsam may be started as the sampling switch SAM is turned on.

Referring to FIG. 4, the sampling time Tsam of the sensing driving time is a time period in which the threshold voltage Vth of the driving transistor DRT or the voltage Vdata_SEN−Vth or Vdata_SEN−ΔVth reflecting a change in the threshold voltage Vth are measured.

The sampling time Tsam of the sensing driving time is a time period in which the voltage of the reference voltage line RVL to which the analog-to-digital converter ADC is connected through the sampling switch SAM is sensed. Here, the voltage of the reference voltage line RVL may correspond to the voltage on the second node N2 of the driving transistor DRT, and correspond to a charging voltage of the line capacitor Crvl formed on the reference voltage line RVL.

During the sampling time Tsam, the voltage Vsen sensed by the analog-to-digital converter ADC may be the voltage Vdata_SEN−Vth obtained by subtracting the threshold voltage Vth from the data signal Vdata_SEN or the voltage Vdata_SEN−ΔVth obtained by subtracting the threshold voltage deviation ΔVth from the data signal Vdata_SEN. The threshold voltage Vth may be a positive threshold voltage or a negative threshold voltage.

Referring to FIG. 4, during the tracking time Ttrack of the sensing driving time, a time taken for the voltage V2 on the second node N2 of the driving transistor DRT to be saturated after having been increased is referred to as a saturation time Tsat.

The saturation time Tsat may be a time taken for the threshold voltage Vth of the driving transistor DRT or a change thereof to be reflected on the voltage V2=Vdata_SEN−Vth on the second node N2 of the driving transistor DRT.

Thus, the time length of the tracking time Ttrack for accurately sensing the threshold voltage Vth should be set to be equal to or shorter than the saturation time Tsat.

The saturation time Tsat may occupy most of the entire time length (hereinafter, also referred to as "sensing time") of the sensing driving time. Since the saturation time Tsat is significantly extended as described above, the entire sensing time for threshold voltage sensing driving should be significantly extended.

Due to the saturation time Tsat according to the sensing driving method as described above, the sensing time for a single subpixel SP may be extended. The higher the resolution of the display panel 110 and the greater the number of the subpixels SP, the longer the time taken to sense all of the subpixels SP disposed in the display panel 110 may be.

While sensing of the display panel 110 is being performed, a user may not be able to watch the display device. Thus, after the display device 100 is powered off, the sensing driving may be performed when the user is not watching the display device 100.

Figure 5:
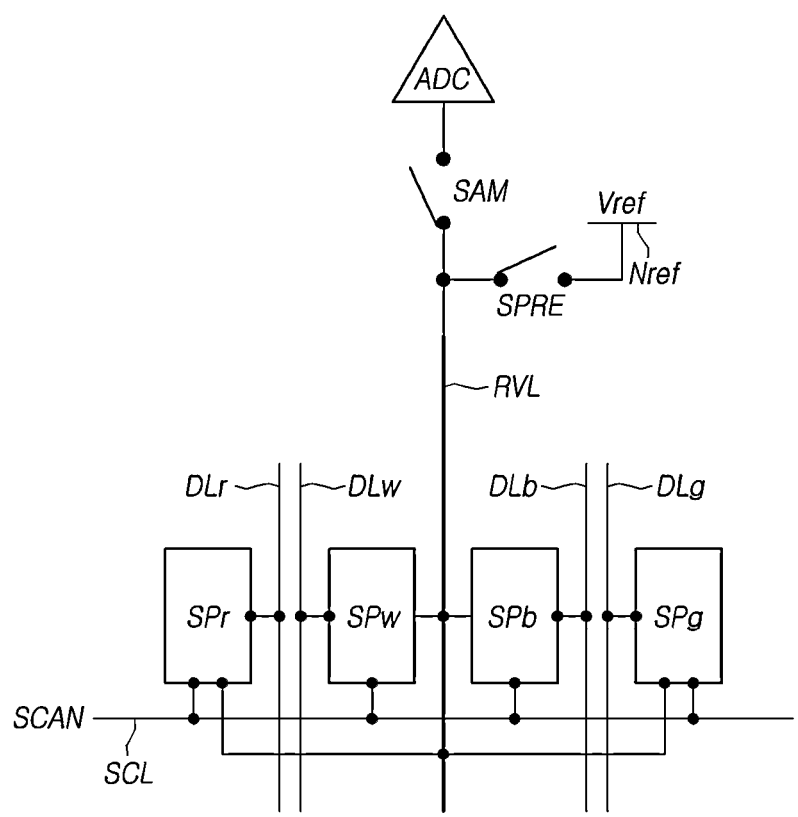
FIG. 5 is a diagram illustrating 4 subpixels and related signal lines in the display device according to embodiments.

FIG. 5 is a diagram illustrating 4 subpixels SPr, SPw, SPb, and SPg and related signal lines DLr, DLw, DLb, DLg, SCL, and RVL in the display device 100 according to embodiments.

Referring to FIG. 5, for example, a plurality of subpixels SP disposed in the display panel 110 according to embodiments may include subpixels SPr, SPw, SPb, and SPg emitting 4 colors of light.

For example, the subpixels SPr, SPw, SPb, and SPg emitting 4 colors of light may include red subpixels SPr emitting red light, white subpixels SPw emitting white light, blue subpixels SPb emitting blue light, and green subpixels SPg emitting green light.

The red subpixels SPr may have the same structure or characteristics. The white subpixels SPw may have the same structure or characteristics. The blue subpixels SPb may have the same structure or characteristics. The green subpixels SPg may have the same structure or characteristics.

For example, the structure of the subpixel SP may include at least one among the positions of arrangement of circuit devices (e.g., ED, DRT, SCT, SENT, and Cst), the sizes of the circuit devices (e.g., ED, DRT, SCT, SENT, and Cst), the area of the entire region of the subpixel SP, the area of the emission region of the subpixel SP, the area of the circuit region of the subpixel SP, and the like.

Referring to FIG. 5, as described above, a single reference voltage line RVL may be disposed for every 4 subpixel columns. For example, a red subpixels SPr, a white subpixel SPw, a blue subpixel SPb, and a green subpixel SPg may share one reference voltage line RVL. That is, the red subpixel SPr, the white subpixel SPw, the blue subpixel SPb, and the green subpixel SPg may be supplied with the reference voltage Vref through a single reference voltage line RVL.

In sensing driving of each of the red subpixel SPr, the white subpixel SPw, the blue subpixel SPb, and the green subpixel SPg, a single reference voltage line RVL may be used.

The drain node or the source node of the sensing transistor SENT of the red subpixel SPr, the drain node or the source node of the sensing transistor SENT of the white subpixel SPw, the drain node or the source node of the sensing transistor SENT of the blue subpixel SPb, and the drain node or the source node of the sensing transistor SENT of the green subpixel SPg may be electrically connected to a single reference voltage line RVL.

The positions of arrangement of the red subpixel SPr, the white subpixel SPw, the blue subpixel SPb, and the green subpixel SPg may be variously designed. For example, when the red subpixel SPr, the white subpixel SPw, the blue subpixel SPb, and the green subpixel SPg are arranged in the order listed, the reference voltage line RVL may be disposed between the white subpixel SPw and the blue subpixel SPb.

The white subpixel SPw and the blue subpixel SPb may be directly connected to the reference voltage line RVL or electrically connected to the reference voltage line RVL through an additional connection pattern. The red subpixel SPr and the green subpixel SPg may be directly connected to the reference voltage line RVL or electrically connected to the reference voltage line RVL through an additional connection pattern.

Referring to FIG. 5, a single power switch SPRE and a single sampling switch SAM may be present for a single reference voltage line RVL.

Referring to FIG. 5, a single analog-to-digital converter ADC may be present for a plurality of reference voltage lines RVL. A sample and hold circuit may be provided between the plurality of sampling switches SAM connected to the plurality of reference voltage lines RVL and the single analog-to-digital converter ADC. Unlike the above, a single analog-to-digital converter ADC may be present for every single reference voltage line RVL. Hereinafter, a situation in which a single analog-to-digital converter ADC is present for a plurality of reference voltage lines RVL will be described as an example.

The red subpixel SPr, the white subpixel SPw, the blue subpixel SPb, and the green subpixel SPg arranged on a single subpixel line may be connected to a single scan signal line SCL. In some cases, the red subpixel SPr, the white subpixel SPw, the blue subpixel SPb, and the green subpixel SPg arranged on a single subpixel line may be connected to a single sensing signal line SENL. Hereinafter, the sensing signal line SENL will be omitted.

Hereinafter, two driving structures and driving methods of the display device 100 according to embodiments will be described with reference to FIGS. 6 to 9. For the sake of explanation, 8 subpixels SPr1, SPw1, SPb1, SPg1, SPr2, SPw2, SPb2, and SPg2 will be described as being disposed on a single subpixel line as an example.

Figure 6:
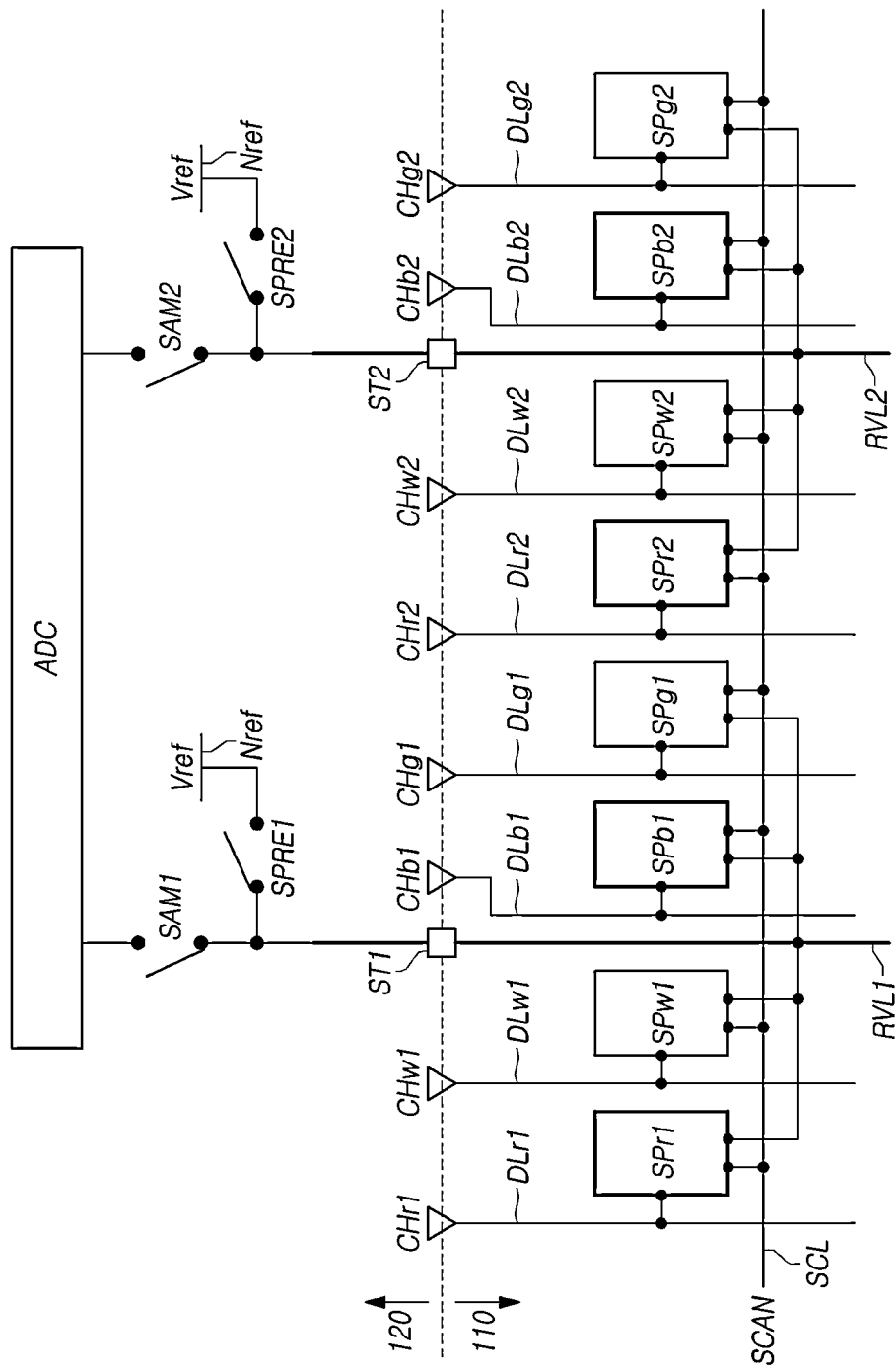
FIG. 6 is a diagram illustrating a structure for a first driving method in the display device according to embodiments.
Figure 7:
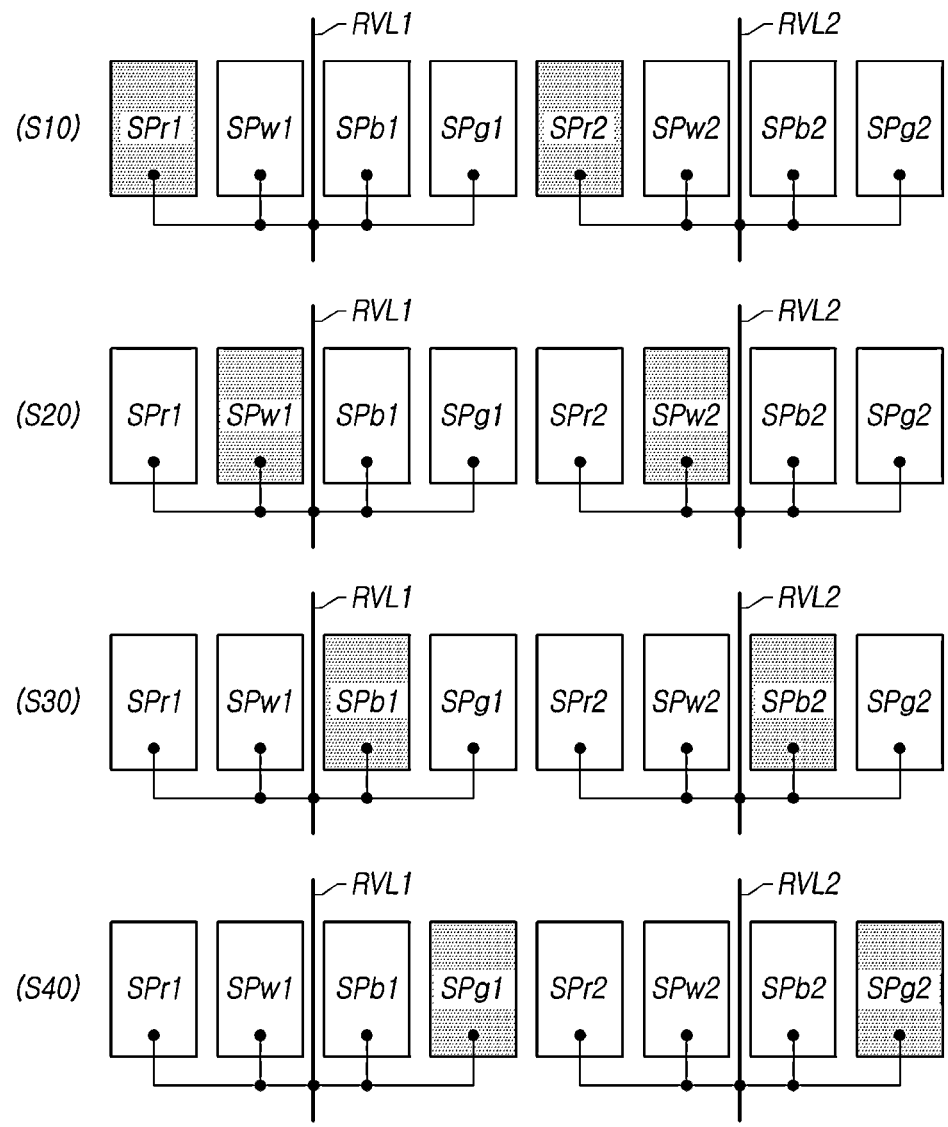
FIG. 7 is a diagram illustrating the order of sensing driving of 8 subpixels by the first driving method in the display device according to embodiments.
Figure 8:
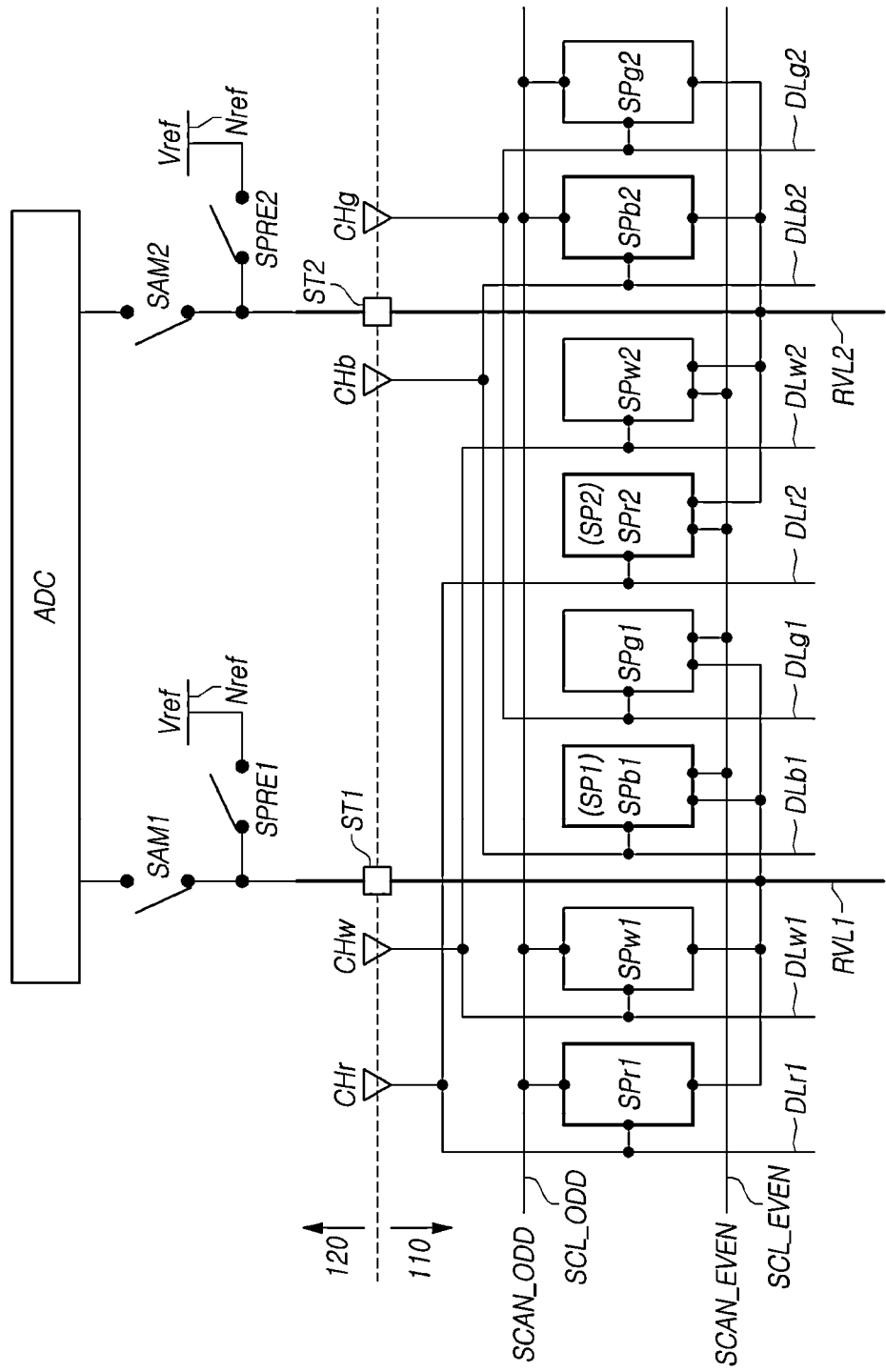
FIG. 8 is a diagram illustrating a structure for a second driving method in the display device according to embodiments.
Figure 9:
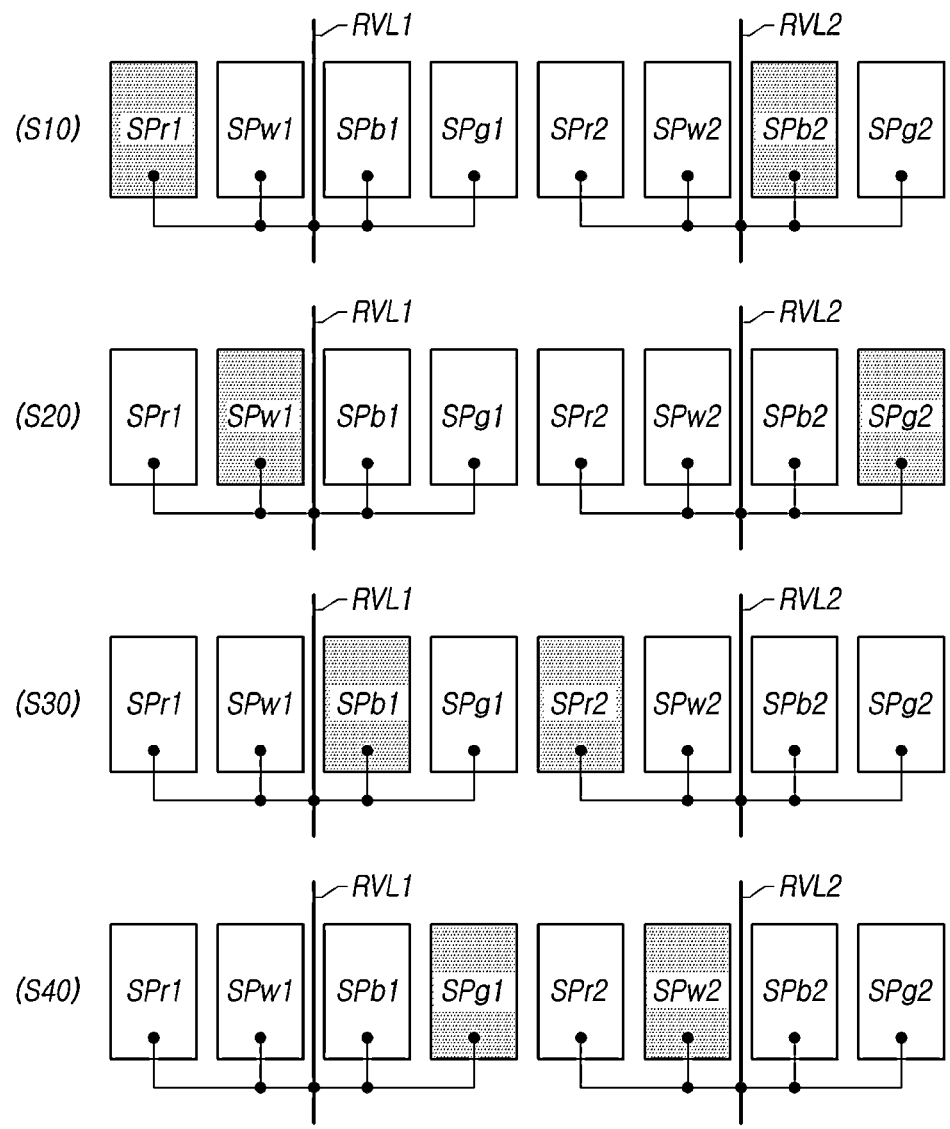
FIG. 9 is a diagram illustrating the order of sensing driving of 8 subpixels by the second driving method in the display device according to embodiments.

FIG. 6 is a diagram illustrating a structure for a first driving method in the display device 100 according to embodiments. FIG. 7 is a diagram illustrating the order of sensing driving of 8 subpixels by the first driving method in the display device 100 according to embodiments. FIG. 8 is a diagram illustrating a structure for a second driving method in the display device 100 according to embodiments. FIG. 9 is a diagram illustrating the order of the sensing driving of 8 subpixels by the second driving method in the display device 100 according to embodiments.

Referring to FIGS. 6 to 9, the 8 subpixels SPr1, SPw1, SPb1, SPg1, SPr2, SPw2, SPb2, and SPg2 may include a first group of subpixels SPr1, SPw1, SPb1, and SPg1 sharing a first reference voltage line RVL1 and a second group of subpixels SPr2, SPw2, SPb2, and SPg2 sharing a second reference voltage line RVL2.

The first group of subpixels SPr1, SPw1, SPb1, and SPg1 may include a red subpixel SPr1, a white subpixel SPw1, a blue subpixel SPb1, and a green subpixel SPg1. The second group of subpixels SPr2, SPw2, SPb2, and SPg2 may include a red subpixel SPr2, a white subpixel SPw2, a blue subpixel SPb2, and a green subpixel SPg2.

Referring to FIGS. 6 to 9, regarding the first reference voltage line RVL1, a first power switch SPRE1 and a first sampling switch SAM1 may be present. Regarding the second reference voltage line RVL2, a second power switch SPRE2 and a second sampling switch SAM2 may be present.

The electrical connection between the first reference voltage line RVL1 and the reference voltage application node Nref may be switched through the first power switch SPRE1. The electrical connection between the second reference voltage line RVL2 and the reference voltage application node Nref may be switched through the second power switch SPRE2.

The electrical connection between the first reference voltage line RVL1 and the analog-to-digital converter ADC may be switched through the first sampling switch SAM1. The electrical connection between the second reference voltage line RVL2 and the analog-to-digital converter ADC may be switched through the second sampling switch SAM2.

Referring to FIGS. 6 to 9, the first power switch SPRE1, the first sampling switch SAM1, the second power switch SPRE2, and the second sampling switch SAM2 may be included in the data driving circuit 120. In this case, the data driving circuit 120 may include a first sensing channel terminal ST1 to which the first reference voltage line RVL1 is connected and a second sensing channel terminal ST2 to which the second reference voltage line RVL2 is connected.

Referring to FIGS. 6 to 9, the 8 subpixels SPr1, SPw1, SPb1, SPg1, SPr2, SPw2, SPb2, and SPg2 may be connected to 8 data lines DLr1, DLw1, DLb1, DLg1, DLr2, DLw2, DLb2, and DLg2, respectively.

Thus, the 8 subpixels SPr1, SPw1, SPb1, SPg1, SPr2, SPw2, SPb2, and SPg2 may be supplied with data signals through the 8 data lines DLr1, DLw1, DLb1, DLg1, DLr2, DLw2, DLb2, and DLg2, respectively.

The data driving circuit 120 may be connected to the 8 data lines DLr1, DLw1, DLb1, DLg1, DLr2, DLw2, DLb2, and DLg2. The structure by which the data driving circuit 120 is connected to the 8 data lines DLr1, DLw1, DLb1, DLg1, DLr2, DLw2, DLb2, and DLg2 may vary depending on the driving method.

Referring to FIG. 6, according to a structure for the first driving method, the data driving circuit 120 may separately and independently drive the 8 data lines DLr1, DLw1, DLb1, DLg1, DLr2, DLw2, DLb2, and DLg2.

The data driving circuit 120 may supply different data signals through the 8 data lines DLr1, DLw1, DLb1, DLg1, DLr2, DLw2, DLb2, and DLg2. In this regard, the data driving circuit 120 may include 8 data channel terminals CHr1, CHw1, CHb1, CHg1, CHr2, CHw2, CHb2, and CHg2 corrected to the 8 data lines DLr1, DLw1, DLb1, DLg1, DLr2, DLw2, DLb2, and DLg2, respectively. The 8 data channel terminals CHr1, CHw1, CHb1, CHg1, CHr2, CHw2, CHb2, and CHg2 may be connected to the data signal provider 300.

Referring to FIG. 8, according to a structure for the second driving method, the data driving circuit 120 may drive the 8 data lines DLr1, DLw1, DLb1, DLg1, DLr2, DLw2, DLb2, and DLg2 by pairing every two data lines thereof.

The data driving circuit 120 may simultaneously drive the data line DLr1 connected to the red subpixel SPr1 included in the first subpixel group and the data line DLr2 connected to the red subpixel SPr2 included in the second subpixel group. In this regard, the data driving circuit 120 may include a single common red data channel terminal CHr to which the data line DLr1 connected to the red subpixel SPr1 included in the first subpixel group and the data line DLr2 connected to the red subpixel SPr2 included in the second subpixel group are connected in common.

When the data driving circuit 120 outputs a data signal through the common red data channel terminal CHr, the data signal may be supplied to both the data line DLr1 connected to the red subpixel SPr1 included in the first subpixel group and the data line DLr2 connected to the red subpixel SPr2 included in the second subpixel group.

The data driving circuit 120 may simultaneously drive the data line DLw1 connected to the white subpixel SPw1 included in the first subpixel group and the data line DLw2 connected to the white subpixel SPw2 included in the second subpixel group.

In this regard, the data driving circuit 120 may include a single common white data channel terminal CHw to which the data line DLw1 connected to the white subpixel SPw1 included in the first subpixel group and the data line DLw2 connected to the white subpixel SPw2 included in the second subpixel group are connected in common.

When the data driving circuit 120 outputs a data signal through the common white data channel terminal CHw, the data signal may be supplied to both the data line DLw1 connected to the white subpixel SPw1 included in the first subpixel group and the data line DLw2 connected to the white subpixel SPw2 included in the second subpixel group.

The data driving circuit 120 may simultaneously drive the data line DLb1 connected to the blue subpixel SPb1 included in the first subpixel group and the data line DLb2 connected to the blue subpixel SPb2 included in the second subpixel group.

In this regard, the data driving circuit 120 may include a single common blue data channel terminal CHb to which the data line DLb1 connected to the blue subpixel SPb1 included in the first subpixel group and the data line DLb2 connected to the blue subpixel SPb2 included in the second subpixel group are connected in common.

When the data driving circuit 120 outputs a data signal to the common blue data channel terminal CHb, the data signal may be supplied to both the data line DLb1 connected to the blue subpixel SPb1 included in the first subpixel group and the data line DLb2 connected to the blue subpixel SPb2 included in the second subpixel group.

The data driving circuit 120 may simultaneously drive the data line DLg1 connected to the green subpixel SPg1 included in the first subpixel group and the data line DLg2 connected to the green subpixel SPg2 included in the second subpixel group.

In this regard, the data driving circuit 120 may include a single common green data channel terminal CHg to which the data line DLg1 connected to the green subpixel SPg1 included in the first subpixel group and the data line DLg2 connected to the green subpixel SPg2 included in the second subpixel group are connected in common.

When the data driving circuit 120 outputs a data signal to the common green data channel terminal CHg, the data signal may be supplied to both the data line DLg1 connected to the green subpixel SPg1 included in the first subpixel group and the data line DLg2 connected to the green subpixel SPg2 included in the second subpixel group.

The common red data channel terminal CHr, the common white data channel terminal CHw, the common blue data channel terminal CHb, and the common green data channel terminal CHg may be connected to the data signal provider 300.

Referring to FIG. 6, according to the structure for the first driving method, a single scan signal line SCL may be disposed for a single subpixel line. That is, the 8 subpixels SPr1, SPw1, SPb1, SPg1, SPr2, SPw2, SPb2, and SPg2 may be connected in common to a single scan signal line SCL.

The 8 subpixels SPr1, SPw1, SPb1, SPg1, SPr2, SPw2, SPb2, and SPg2 may be supplied in common with the scan signal SCAN through a single scan signal line SCL.

Referring to FIG. 8, according to a structure for the second driving method, 2 scan signal lines SCL_ODD and SCL_EVEN may be disposed for a single subpixel line.

Some of the 8 subpixels SPr1, SPw1, SPb1, SPg1, SPr2, SPw2, SPb2, and SPg2 may be connected to a first scan signal line SCL_ODD of two scan signal lines SCL_ODD and SCL_EVEN, and some others may be connected to a second scan signal line SCL_EVEN of the two scan signal lines SCL_ODD and SCL_EVEN.

For example, the first scan signal line SCL_ODD may be connected to the red subpixel SPr1 and the white subpixel SPw1 of the first subpixel group and the blue subpixel SPb2 and the green subpixel SPg2 of the second subpixel group.

The second scan signal line SCL_EVEN may be connected to the blue subpixel SPb1 and the green subpixel SPg1 of the first subpixel group and the red subpixel SPr2 and the white subpixel SPw2 of the second subpixel group.

The first driving method described herein may be referred to as a single-rate driving (SRD) method, whereas the second driving method described herein may be referred to as a double-rate driving (DRD) method. According to the second driving method, the number of data channels of the data driving circuit 120 may be reduced by half.

As described above, the reference voltage line RVL serves as a sensing path, and thus the display device 100 may not simultaneously perform the sensing driving of each of subpixels SP connected to a single reference voltage line RVL.

Consequently, the display device 100 may perform the sensing driving of only one of the subpixels SP connected to the single reference voltage line RVL.

Referring to FIGS. 6 to 9, the display device 100 may not simultaneously perform the sensing driving of each of the red subpixel SPr1, the white subpixel SPw1, the blue subpixel SPb1, and the green subpixel SPg1 included in the first group of subpixels SPr1, SPw1, SPb1, and SPg1 sharing the first reference voltage line RVL1.

The display device 100 may not simultaneously perform the sensing driving of each of the red subpixel SPr2, the white subpixel SPw2, the blue subpixel SPb2, and the green subpixel SPg2 included in the second group of subpixels SPr2, SPw2, SPb2, and SPg2 sharing the second reference voltage line RVL2.

Referring to FIG. 7, in the sensing driving according to the first driving method, the display device 100 may simultaneously sense the subpixels SP of the same color using the first reference voltage line RVL1 and the second reference voltage line RVL2.

In step S10, the display device 100 may simultaneously perform the sensing driving of the red subpixel SPr1 connected to the first reference voltage line RVL1 and the sensing driving of the red subpixel SPr2 connected to the second reference voltage line RVL2.

In step S20, the display device 100 may simultaneously perform the sensing driving of the white subpixel SPw1 connected to the first reference voltage line RVL1 and the sensing driving of the white subpixel SPw2 connected to the second reference voltage line RVL2.

In step S30, the display device 100 may simultaneously perform the sensing driving of the blue subpixel SPb1 connected to the first reference voltage line RVL1 and the sensing driving of the blue subpixel SPb2 connected to the second reference voltage line RVL2.

In step S40, the display device 100 may simultaneously perform the sensing driving of the green subpixel SPg1 connected to the first reference voltage line RVL1 and the sensing driving of the green subpixel SPg2 connected to the second reference voltage line RVL2.

As described above, in the sensing driving according to the first driving method, the subpixels SP of the same color may be simultaneously sensed using the first reference voltage line RVL1 and the second reference voltage line RVL2, since the data lines DLr1, DLw1, DLb1, DLg1, DLr2, DLw2, DLb2, and DLg2 may be separately and independently driven.

Referring to FIGS. 8 and 9, in the sensing driving according to the second driving method, the data lines DLr1, DLw1, DLb1, DLg1, DLr2, DLw2, DLb2, and DLg2 are not separately and independently driven. In a structure according to the second driving method, among the data lines DLr1, DLw1, DLb1, DLg1, DLr2, DLw2, DLb2, and DLg2, two data lines DL connected to two subpixels SP emitting the same color of light are simultaneously driven.

Thus, referring to FIG. 9, in the sensing driving according to the second driving method, the subpixels SP of different colors may be simultaneously sensed using the first reference voltage line RVL1 and the second reference voltage line RVL2.

For example, referring to FIG. 9, in the sensing driving according to the second driving method, the red subpixels and the blue subpixels may be simultaneously sensed and the white subpixels and the green subpixels may be simultaneously sensed using the first reference voltage line RVL1 and the second reference voltage line RVL2.

In step S10, the display device 100 may simultaneously perform the sensing driving of the red subpixel SPr1 connected to the first reference voltage line RVL1 and the sensing driving of the blue subpixel SPb2 connected to the second reference voltage line RVL2.

In step S20, the display device 100 may simultaneously perform the sensing driving of the white subpixel SPw1 connected to the first reference voltage line RVL1 and the sensing driving of the green subpixel SPg2 connected to the second reference voltage line RVL2.

In step S30, the display device 100 may simultaneously perform the sensing driving of the blue subpixel SPb1 connected to the first reference voltage line RVL1 and the sensing driving of the red subpixel SPr2 connected to the second reference voltage line RVL2.

In step S40, the display device 100 may simultaneously perform the sensing driving of the green subpixel SPg1 connected to the first reference voltage line RVL1 and the sensing driving of the white subpixel SPw2 connected to the second reference voltage line RVL2.

FIG. 10A illustrates graphs comparing the sizes S (Sr, Sw, Sb, and Sg) of driving transistors DRT included in subpixels SPr, SPw, SPb, and SPg for 4 colors (red, white, blue, and green) in the display device 100 according to embodiments, and FIG. 10B illustrates graphs comparing saturation times Tsat (Tsat_R, Tsat_W, Tsat_B, and Tsat_G) required in the sensing driving of the subpixels SPr, SPw, SPb, and SPg for 4 colors (red, white, blue, and green) in the display device 100 according to embodiments when the relationship of the sizes Sr, Sw, Sb, and Sg) of the driving transistors DRT included in the subpixels SPr, SPw, SPb, and SPg for 4 colors (red, white, blue, and green) has three cases as in FIG. 10A.

Referring to Case 1, the sizes Sr, Sw, Sb, and Sg of the driving transistors DRT included in the subpixels SPr, SPw, SPb, and SPg for 4 colors may be the same.

Referring to Case 2, in the subpixels for 4 colors (red, white, blue, and green), the sizes Sw and Sb of the driving transistors DRT included in the white subpixel SPw and the blue subpixel SPb, respectively, may be the same or have a difference only within a predetermined range. The sizes Sr and Sg of the driving transistors DRT included in the red subpixel SPr and the green subpixel SPg may be the same or have a difference only within a predetermined range.

Referring to Case 2, the sizes Sw and Sb of the driving transistors DRT included in the white subpixel SPw and the blue subpixel SPb, respectively, may be smaller than the sizes Sr and Sg of the driving transistors DRT included in the red subpixel SPr and the green subpixel SPg.

Referring to Case 3, all of the sizes Sr, Sw, Sb, and Sg of the driving transistors DRT included in the subpixels SPr, SPw, SPb, and SPg for 4 colors (red, white, blue, and green) may be different from each other.

Among the driving transistors DRT included in the subpixels SPr, SPw, SPb, and SPg for 4 colors (red, white, blue, and green), the size Sr of the driving transistor DRT included in the red subpixel SPr may be greatest, the size Sg of the driving transistor DRT included in the green subpixel SPg may be second greatest, the size Sw of the driving transistor DRT included in the white subpixel SPw may be third greatest, and the size Sb of the driving transistor DRT included in the blue subpixel SPb may be smallest.

For example, the size of the driving transistor DRT may mean the channel size of the driving transistor DRT. Here, the channel size may be expressed by a value obtained by dividing the channel width with the channel length.

The greater the size (i.e., channel size) of the driving transistor DRT, the lower the channel resistance of the driving transistor DRT may be. Thus, current (i.e., driving current) flowing through the driving transistor DRT may be increased. In contrast, the smaller the size (i.e., channel size) of the driving transistor DRT, the higher the channel resistance of the driving transistor DRT may be, thereby reducing current (i.e., driving current) flowing through the driving transistor DRT.

During the tracking time Ttrack of the sensing driving time, the line capacitor Crvl on the reference voltage line RVL is charged with current supplied through the driving transistor DRT and the sensing transistor SENT. Thus, the voltage of the reference voltage line RVL may be increased.

Thus, the difference in the size (i.e., channel size) of the driving transistor DRT may cause a difference in the voltage rise rate of the reference voltage line RVL, thereby leading to a difference in the saturation time Tsat.

The size S of the driving transistor DRT may be inversely proportional to the saturation time Tsat. When the size (i.e., channel size) of the driving transistor DRT is greater, flow of current through the driving transistor DRT may be facilitated. The voltage rise rate of the reference voltage line RVL may be increased, and thus the saturation time Tsat may be reduced. When the size (i.e., channel size) of the driving transistor DRT is smaller, flow of current through the driving transistor DRT may not be easy. The voltage rise rate of the reference voltage line RVL may be reduced, and thus the saturation time Tsat may be extended.

Referring to FIG. 10B, as in Case 1 of FIG. 10A, when the sizes Sr, Sw, Sb, and Sg of the driving transistors DRT included in the subpixels SPr, SPw, SPb, and SPg for 4 colors (red, white, blue, and green) are the same, the saturation times Tsat (Tsat_R, Tsat_W, Tsat_B, and Tsat_G) required in the sensing driving of the subpixels SPr, SPw, SPb, and SPg for 4 colors (red, white, blue, and green) may be the same.

Referring to FIG. 10B, as in Case 2 of FIG. 10A, when the sizes Sw and Sb of the driving transistors DRT included in the white and blue subpixels SPw and SPb among the subpixels SPr, SPw, SPb, and SPg for 4 colors (red, white, blue, and green) are smaller than the sizes Sr and Sg of the driving transistor DRT included in the red and green subpixels SPr and SPg, the saturation times Tsat_W and Tsat_B for the white and blue subpixels SPw and SPb may be longer than the saturation times Tsat_R and Tsat_G for the red and green subpixels SPr and SPg.

Referring to FIG. 10B, as in Case 3 of FIG. 10A, when the sizes Sr, Sw, Sb, and Sg of the driving transistor DRT included in the subpixels SPr, SPw, SPb, and SPg for 4 colors (red, white, blue, and green) are different, the saturation times Tsat (Tsat_R, Tsat_W, Tsat_B, and Tsat_G) required in the sensing driving of the subpixels SPr, SPw, SPb, and SPg for 4 colors (red, white, blue, and green) may be different from each other.

For example, the saturation time Tsat_B for the blue subpixel SPb may be longest, the saturation time Tsat_W for the white subpixel SPw may be second longest, the saturation time Tsat_G for the green subpixel SPg may be third longest, and the saturation time Tsat_R for the red subpixel SPr may be shortest.

Figure 11:
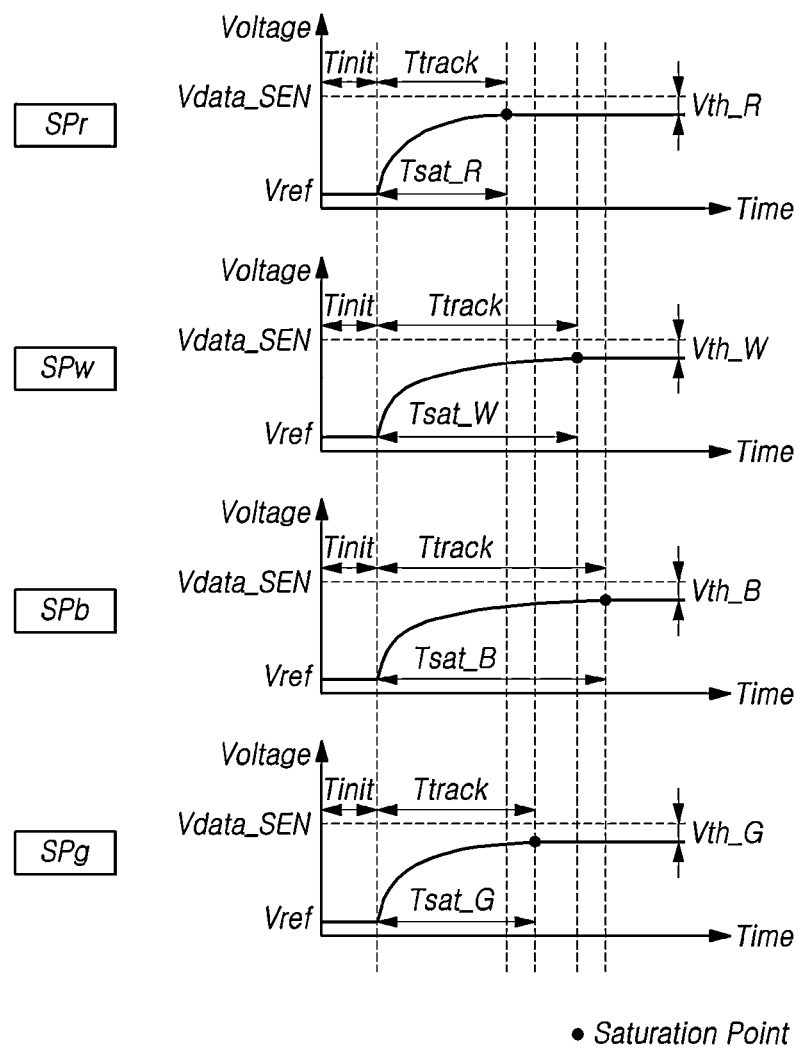
FIG. 11 is graphs illustrating changes in the voltage of the reference voltage line during the sensing driving time for the subpixels for 4 colors in the display device according to embodiments.

FIG. 11 is graphs illustrating changes in the voltage of the reference voltage line RVL during the sensing driving time for the subpixels SPr, SPw, SPb, and SPg for 4 colors (red, white, blue, and green) in the display device 100 according to embodiments. Here, the illustration of FIG. 11 is based on Case 3 in FIGS. 10A and 10B.

As described above, in Case 3, the saturation time Tsat_B for the blue subpixel SPb may be longest, the saturation time Tsat_W for the white subpixel SPw may be second longest, the saturation time Tsat_G for the green subpixel SPg may be third longest, and the saturation time Tsat_R for the red subpixel SPr may be shortest.

For accurate sensing of the threshold voltage Vth_R for the red subpixel SPr, the length of the tracking time Ttrack is required to be longer than at least the saturation time Tsat_R. For accurate sensing of the threshold voltage Vth_W for the white subpixel SPw, the length of the tracking time Ttrack is required to be longer than at least the saturation time Tsat_W. For accurate sensing of the threshold voltage Vth_B for the blue subpixel SPb, the length of the tracking time Ttrack is required to be longer than at least the saturation time Tsat_B. For accurate sensing of the threshold voltage Vth_G for the green subpixel SPg, the length of the tracking time Ttrack is required to be longer than at least the saturation time Tsat_G.

Thus, for accurate sensing of each color without unnecessary time loss, the tracking time Ttrack is required to have different lengths for the red subpixel SPr, the white subpixel SPw, the blue subpixel SPb, and the green subpixel SPg, respectively.

That is, for accurate sensing of each color without unnecessary time loss, turn-on timing (hereinafter, referred to as sampling timing) of the sampling switch SAM is required to be set different for each color of the red subpixel SPr, the white subpixel SPw, the blue subpixel SPb, and the green subpixel SPg.

Hereinafter, embodiments may provide a method able to rapidly and accurately sense threshold voltages (Vth_R, Vth_W, Vth_B, and Vth_G) for the red subpixel SPr, the white subpixel SPw, the blue subpixel SPb, and the green subpixel SPg.

Figure 12:
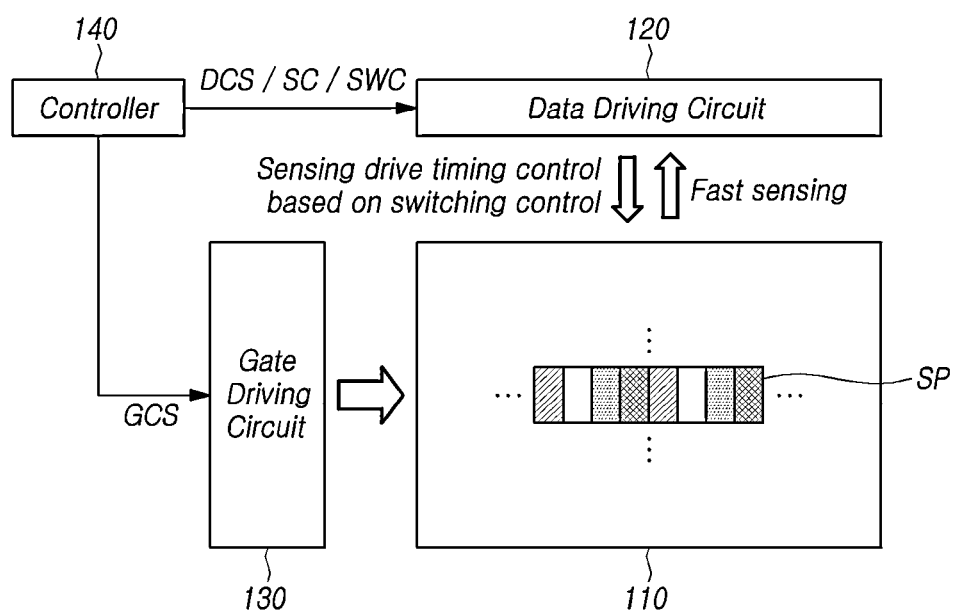
FIG. 12 is a diagram illustrating a sensing control system of the display device according to embodiments.

FIG. 12 is a diagram illustrating a sensing control system of the display device 100 according to embodiments.

The display device 100 according to embodiments may include: the display panel 110 including a plurality of subpixels SP, a plurality of data lines DL, a plurality of gate lines GL, and a plurality of reference voltage lines RVL; the data driving circuit 120 configured to drive the plurality of data lines DL; the gate driving circuit 130 configured to drive the plurality of gate lines GL; the controller 140 configured to control the data driving circuit 120 and the gate driving circuit 130; and the like.

The display device 100 according to embodiments may include a sensing control system to control the sensing driving. The sensing control system may include the controller 140, the data driving circuit 120, the gate driving circuit 130, and the like.

The sensing control system may reduce a sensing time.

The sensing control system may control sensing driving timing on the basis of switching control, thereby rapidly performing the sensing.

Alternatively, the sensing control system may control sensing driving operations of two subpixels SP performed simultaneously so that the sensing driving operations are at the same time.

Alternatively, the sensing control system may control sensing driving operations of two subpixels SP which are performed simultaneously to be started at the same time.

A sensing driving time for each of the subpixels SP may include an initialization time Tinit, a tracking time Ttrack, and a sampling time Tsam. A sensing time for each of the subpixels SP may mean the time length of the sensing driving time.

In the sensing control system, the controller 140 may transfer data drive control signals DCS, sensing driving control signals SC, and switching control signals SWC to the data driving circuit 120.

The data driving circuit 120 may control switching control-based sensing driving timing using the switching control signals SWC received from the controller 140.

The data driving circuit 120 may control initialization timing using the switching control signals SWC received from the controller 140. Here, the initialization timing may include at least one of initialization start timing regarding the start of the initialization time Tinit and initialization end timing regarding the end of the initialization time Tinit. The initialization end timing may be the same as tracking start timing.

The data driving circuit 120 may control tracking timing using the switching control signals SWC received from the controller 140. Here, the tracking timing may include at least one of tracking start timing regarding the start of the tracking time Ttrack and tracking end timing regarding the end of the tracking time Ttrack. The tracking start timing may be the same as the initialization end timing. The tracking end timing may be the same as the sampling start timing.

The data driving circuit 120 may control the sampling timing using the switching control signals SWC received from the controller 140. Here, the sampling timing may include at least one of sampling start timing regarding the start of the sampling time Tsam and sampling end timing regarding the end of the sampling time Tsam. The sampling start timing may be the same as the tracking end timing.

The switching control signals SWC may include on-off control signals for at least one of the power switch SPRE and the sampling switch SAM connected to each reference voltage line RVL.

The switching control signals SWC may include on-off control signals for the power switch SPRE, of the power switch SPRE and the sampling switch SAM connected to each reference voltage line RVL, for controlling at least one of the initialization start timing and the tracking start timing (or the initialization end timing).

The switching control signals SWC may include on-off control signals for the sampling switch SAM, of the power switch SPRE and the sampling switch SAM connected to each reference voltage line RVL, for controlling the sampling start timing (or the tracking end timing).

Hereinafter, a sensing control method will be described in more detail with reference to FIGS. 15A, 15B, 16A, 16B, 17A, and 17B. An example circuit for describing the sensing control will be briefly described with reference to FIG. 13, and the channel size of the driving transistor DRT will be described with reference to FIGS. 14A and 14B.

The sensing control according to embodiments may be applied to the first driving method and the structure thereof described above with reference to FIG. 6, and be applied to the second driving method and the structure thereof described above with reference to FIG. 8. For the sake of brevity, sensing control applied to the second driving method and the structure thereof described above with reference to FIG. 8 will be described as an example.

Figure 13:
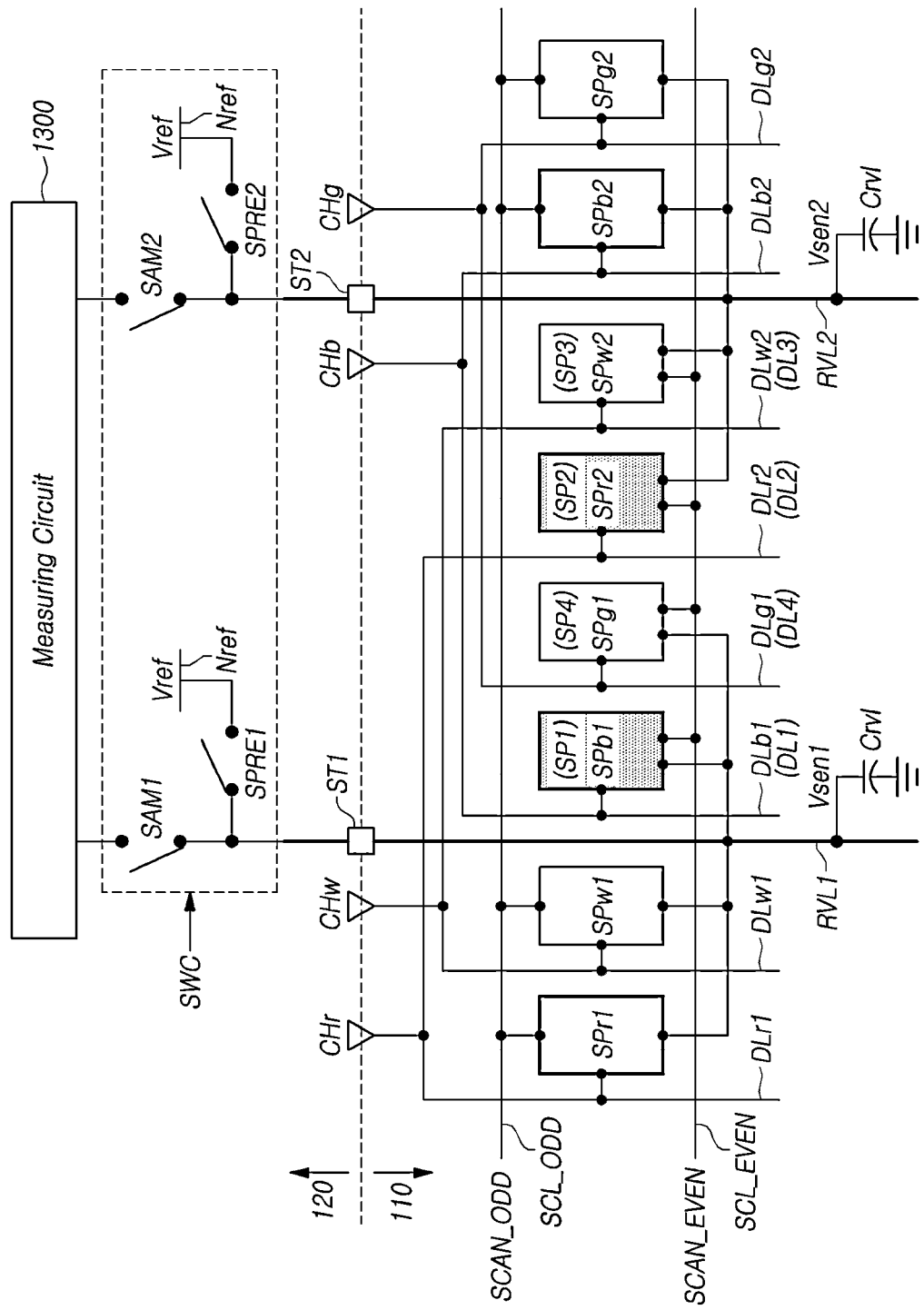
FIG. 13 is a circuit illustrating sensing control by the sensing control system according to embodiments.

FIG. 13 is a circuit illustrating sensing control by the sensing control system according to embodiments. The circuit illustrated in FIG. 13 has a structure for the second driving method, and is the same as the circuit illustrated in FIG. 8.

Referring to FIG. 13, the display panel 110 may include a plurality of data lines DL, a plurality of scan signal lines SCL, a plurality of reference voltage lines RVL, and a plurality of subpixels SP.

The plurality of scan signal lines SCL may include a plurality of first scan signal lines SCL_ODD and a plurality of second scan signal lines SCL_EVEN.

Referring to FIG. 13, when each subpixel SP has a 2-scan structure, i.e., when the gate nodes of the scan transistor SCT and the sensing transistor SENT included in each subpixel SP are controlled separately, the display panel 110 may further include the plurality of sensing signal lines SENL.

Referring to FIG. 13, when each subpixel SP has a 1-scan structure, i.e., when the gate nodes of the scan transistor SCT and the sensing transistor SENT included in each subpixel SP are controlled in common, the display panel 110 does not further include the plurality of sensing signal lines SENL.

The first scan signal line SCL_ODD may be connected to a red subpixel SPr1 and a white subpixel SPw1 of a first subpixel group and a blue subpixel SPb2 and a green subpixel SPg2 of a second subpixel group.

The second scan signal line SCL_EVEN may be connected to a blue subpixel SPb1 and a green subpixel SPg1 of the first subpixel group and a red subpixel SPr2 and a white subpixel SPw2 of the second subpixel group.

Referring to FIG. 13, the plurality of subpixels SP may include the first subpixel group connected to the first reference voltage line RVL1 and the second subpixel group connected to a second reference voltage line RVL2.

Referring to FIG. 13, the first subpixel group may include a first subpixel SP1, and the second subpixel group may include a second subpixel SP2.

The first subpixel SP1 may be connected to a first data line DL1 and a first reference voltage line RVL1. The first subpixel SP1 may include an emitting device ED, a driving transistor DRT, and the like. For example, the first subpixel SP1 may be one of the blue subpixel SPb and the white subpixel SPw including a driving transistor DRT having a relatively small channel size among the red, white, blue, and green subpixels SPr, SPw, SPb, and SPg.

The second subpixel SP2 may be connected to a second data line DL2 and the second reference voltage line RVL2. The second subpixel SP2 may include an emitting device ED, a driving transistor DRT, and the like. For example, the second subpixel SP2 may be one of the red subpixel SPr and the green subpixel SPg including a driving transistor DRT having a relatively large channel size among the red, white, blue, and green subpixels SPr, SPw, SPb, and SPg.

Referring to FIG. 13, for example, the first subpixel SP1 may be the blue subpixel SPb1 included in the first subpixel group, and the second subpixel SP2 may be the red subpixel SPr2 included in the second subpixel group. Thus, the first data line DL1 will be illustrated as being a data line DLb1 connected to the blue subpixel SPb1 included in the first subpixel group, and the second data line DL2 will be illustrated as being a data line DLr2 connected to the red subpixel SPr2 included in the second subpixel group.

Referring to FIG. 13, the first subpixel SP1 and the second subpixel SP2 may be connected in common to the second scan signal line SCL_EVEN.

The first subpixel SP1 may emit light having a first color, whereas the second subpixel SP2 may emit light having a second color different from the first color. For example, the first color may be blue or white, whereas the second color may be red or green.

Referring to FIGS. 8, 9, and 13, in a structure for the second driving method, when different colors of light are emitted from the first subpixel SP1 and the second subpixel SP2, the driving time of the first subpixel SP1 and the driving time of the second subpixel SP2 may overlap in time. That is, the sensing driving of the first subpixel SP1 and the sensing driving of the second subpixel SP2 may be performed at the same time.

Referring to FIGS. 6 and 7, in a structure for the first driving method, when different colors of light are emitted from the first subpixel SP1 and the second subpixel SP2, the driving time of the first subpixel SP1 and the driving time of the second subpixel SP2 may not overlap in time. That is, the sensing driving of the first subpixel SP1 and the sensing driving of the second subpixel SP2 may be performed in different time periods.

Referring to FIG. 13, no other subpixels are disposed between the first subpixel SP1 and the first reference voltage line RVL1. A third subpixel SP3 may be disposed between the second subpixel SP2 and the second reference voltage line RVL2. A fourth subpixel SP4 may be disposed between the first subpixel SP1 and the second subpixel SP2.

The third subpixel SP3 may be connected to a third data line DL3. The third subpixel SP3 may be connected to the second reference voltage line RVL2. That is, the second subpixel SP2 and the third subpixel SP3 may share the second reference voltage line RVL2.

The fourth subpixel SP4 may be connected to a fourth data line DL4. The fourth subpixel SP4 may be connected to the first reference voltage line RVL1. That is, the first subpixel SP1 and the fourth subpixel SP4 may share the first reference voltage line RVL1.

Referring to FIG. 13, the third subpixel SP3 will be illustrated as being the white subpixel SPw2 included in the second subpixel group, and the fourth subpixel SP4 will be illustrated as being the green subpixel SPg1 included in the first subpixel group.

Thus, the third data line DL3 will be illustrated as being the data line DLw2 connected to the white subpixel SPw2 included in the second subpixel group, whereas the fourth data line DL4 will be illustrated as being the data line DLg1 connected to the green subpixel SPg1 included in the first subpixel group.

Referring to FIG. 13, the data driving circuit 120 according to embodiments may include a first data channel terminal CHb electrically connected to the first data line DL1, a second data channel terminal CHr electrically connected to the second data line DL2, a first sensing channel terminal ST1 electrically connected to the first reference voltage line RVL1, and a second sensing channel terminal ST2 electrically connected to the second reference voltage line RVL2, and a data signal provider 300. The data signal provider 300 outputs a first data signal Vdata to the first data channel terminal CHb and outputs a second data signal Vdata to the second data channel terminal CHr.

Referring to FIG. 13, the data driving circuit 120 according to embodiments may include a first power switch SPRE1, a first sampling switch SAM1, a second power switch SPRE2, a second sampling switch SAM2, and a measuring circuit 1300.

The measuring circuit 1300 may be configured to measure the voltages of the first reference voltage line RVL1 and the second reference voltage line RVL2, respectively.

Referring to FIG. 13, the first power switch SPRE1 may switch the connection between the first reference voltage line RVL1 and the reference voltage application node Nref. The first sampling switch SAM1 may switch the connection between the first reference voltage line RVL1 and the measuring circuit 1300.

Referring to FIG. 13, the second power switch SPRE2 may switch the connection between the second reference voltage line RVL2 and the reference voltage application node Nref. The second sampling switch SAM2 may switch the connection between the second reference voltage line RVL2 and the voltage measuring circuit 1300.

The measuring circuit 1300 may include at least one analog-to-digital converter ADC. The measuring circuit 1300 may further include a first sample and hold circuit in which the voltage of the first reference voltage line RVL1 is stored and a second sample and hold circuit in which the voltage of the second reference voltage line RVL2 is stored.

The analog-to-digital converter ADC may convert a voltage stored in one of the first sample and hold circuit and the second sample and hold circuit into a sensing value corresponding to a digital voltage.

Since FIG. 13 illustrates the structure for the second driving method (i.e., a double-rate driving structure), the first data channel terminal CHb may be electrically connected in common to the first data line DL1 (i.e., DLb1) and the other data line DLb2, whereas the second data channel terminal CHr may be electrically connected in common to the second data line DL2 (i.e., Lr2) and the other data line DLr1.

In addition, in an active period, the first data signal Vdata output to the first data line DL1 may be an image data signal regarding the first color, and be changed by the voltage of the first sensing channel terminal ST1.

In the active period, the second data signal Vdata output to the second data line DL2 may be an image data signal regarding the second color different from the first color, and be changed by the voltage of the second sensing channel terminal ST2.

When a user powers off the display device 100 using a remote control or the like, a power-off signal is generated. After the power-off signal is generated, sensing driving for sensing a threshold voltage may be performed. In consideration of these features, after the power-off signal is generated, the first data signal Vdata output to the first data line DL1 and the second data signal Vdata output to the second data line DL2 may be sensing driving data signals Vdata_SEN having the same voltage value.

Figure 14A:
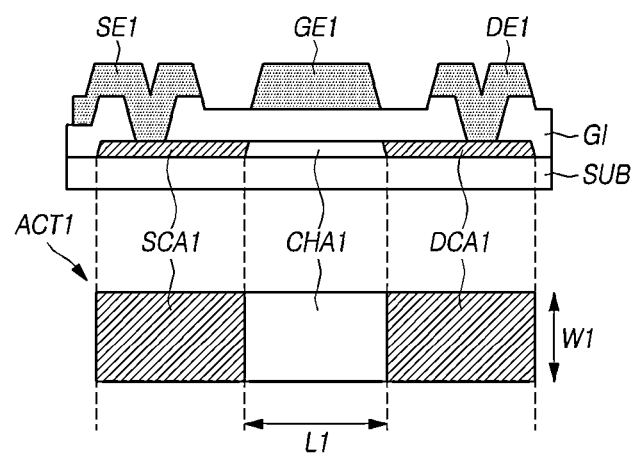
FIGS. 14A and 14B are cross-sectional diagrams illustrating a driving transistor included in a first subpixel and a driving transistor included in a second subpixel in the display device according to embodiments.
Figure 14B:
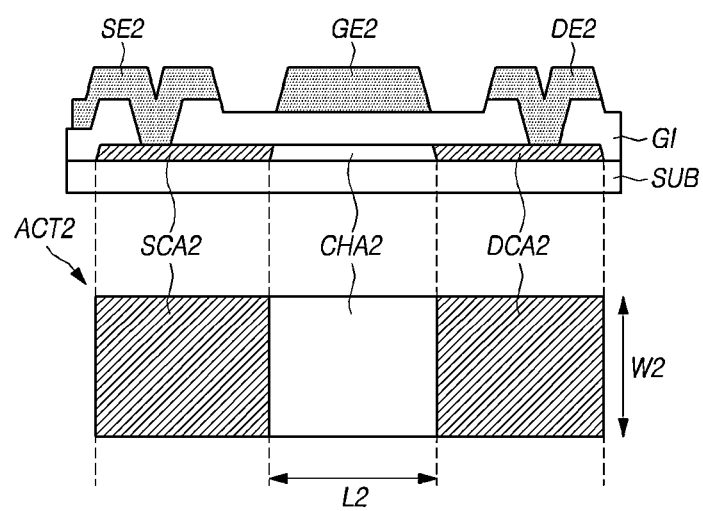

FIGS. 14A and 14B are cross-sectional diagrams illustrating a driving transistor DRT included in the first subpixel SP1 and a driving transistor DRT included in the second subpixel SP2 in the display device 100 according to embodiments. Here, the driving transistors DRT illustrated in FIGS. 14A and 14B will be assumed to have a coplanar structure in which source electrodes SE1 and SE2, drain electrodes DE1 and DE2, and gate electrodes GE1 and GE2 are positioned on the same plane.

Referring to FIG. 14A, the driving transistor DRT included in the first subpixel SP1 may include the source electrode SE1, the drain electrode DE1, the gate electrode GE1, and a semiconductor layer ACT1.

The semiconductor layer ACT1 is disposed on the substrate SUB. The semiconductor layer ACT1 may be an oxide semiconductor layer, and include a source area SCA1 electrically connected to the source electrode SE1, a drain area DCA1 electrically connected to the drain electrode DE1, and a channel area CHA1.

In the semiconductor layer ACT1, the source area SCA1 and the drain area DCA1 may be conductorized areas, respectively. In the semiconductor layer ACT1, the channel area CHA1 may be a remaining semiconductor area that has not been conductorized, and overlap the gate electrode GE1.

A gate insulation film GI may be disposed on the semiconductor layer ACT1, and the source electrode SE1, the drain electrode DE1, and the gate electrode GE1 may be disposed on the gate insulation film GI. The source electrode SE1 may be connected to the source area SCA1 of the semiconductor layer ACT1 through a contact hole of the gate insulation film GI. The drain electrode DE1 may be connected to the drain area DCA1 of the semiconductor layer ACT1 through another contact hole of the gate insulation film GI.

Referring to FIG. 14B, the driving transistor DRT included in the second subpixel SP2 may include the source electrode SE2, the drain electrode DE2, the gate electrode GE2, and a semiconductor layer ACT2.

The semiconductor layer ACT2 is disposed on the substrate SUB. The semiconductor layer ACT2 may be an oxide semiconductor layer, and include a source area SCA2 electrically connected to the source electrode SE2, a drain area DCA2 electrically connected to the drain electrode DE2, and a channel area CHA2.

In the semiconductor layer ACT2, the source area SCA2 and the drain area DCA2 are be conductorized areas, respectively. In the semiconductor layer ACT2, the channel area CHA2 may be a remaining semiconductor area that has not been conductorized, and overlap the gate electrode GE2.

The gate insulation film GI may be disposed on the semiconductor layer ACT2, and the drain electrode DE2 and the gate electrode GE2 may be disposed on the gate insulation film GI. The source electrode SE2 may be electrically connected to the source area SCA2 of the semiconductor layer ACT2 through a contact hole of the gate insulation film GI. The drain electrode DE2 may be electrically connected to the drain area DCA2 of the semiconductor layer ACT2 through another contact hole of the gate insulation film GI.

Referring to FIGS. 14A and 14B in consideration of Cases 1 to 3 in FIG. 10A, the channel size S1 of the driving transistor DRT included in the first subpixel SP1 may be equal to or smaller than the channel size S2 of the driving transistor DRT included in the second subpixel SP2. Referring to Cases 1 and 2 in FIG. 10A, the channel size S1 of the driving transistor DRT included in the first subpixel SP1 may be smaller than the channel size S2 of the driving transistor DRT included in the second subpixel SP2.

Referring to FIG. 14A, in the driving transistor DRT included in the first subpixel SP1, the channel size S1 of the channel area CHA1 may be proportional to a value W1/L1 obtained by dividing the channel width W1 with the channel length L1.

Referring to FIG. 14B, in the driving transistor DRT included in the second subpixel SP2, the channel size S2 of the channel area CHA2 may be proportional to a value W2/L2 obtained by dividing the channel width W2 with the channel length L2.

Referring to FIG. 13, the channel size of the driving transistor DRT included in the third subpixel SP3 and the channel size of the driving transistor DRT included in the fourth subpixel SP4 will be described on the assumption that the third subpixel SP3 is the white subpixel SPw2 included in the second subpixel group and the fourth subpixel SP4 is the green subpixel SPg1 included in the first subpixel group.

Referring to Cases 1 to 3 in FIG. 10A, the channel size of the driving transistor DRT included in the third subpixel SP3 may be equal to or smaller than the channel size S2 of the driving transistor DRT included in the second subpixel SP2. Referring to Cases 2 and 3 in FIG. 10A, the channel size of the driving transistor DRT included in the third subpixel SP3 may be smaller than the channel size S2 of the driving transistor DRT included in the second subpixel SP2.

Referring to Cases 1 to 3 in FIG. 10A, the channel size of the driving transistor DRT included in the fourth subpixel SP4 may be equal to or greater than the channel size S1 of the driving transistor DRT included in the first subpixel SP1. Referring to Cases 2 and 3 in FIG. 10A, the channel size of the driving transistor DRT included in the fourth subpixel SP4 may be greater than the channel size S1 of the driving transistor DRT included in the first subpixel SP1.

FIGS. 15A, 15B, 16A, 16B, 17A, and 17B are timing diagrams illustrating switching control-based sensing driving control of the first subpixel SP1 and the second subpixel SP2 in the display device 100 according to embodiments.

Referring to FIGS. 15A, 15B, 16A, 16B, 17A, and 17B, the driving time of the first subpixel SP1 may include a first initialization time Tinit1 in which the reference voltage Vref is applied to the first reference voltage line RVL1, a first tracking time Ttrack1 in which the voltage of the first reference voltage line RVL1 increases from the reference voltage Vref and then is saturated, and a first sampling time Tsam1 in which the voltage of the first reference voltage line RVL1 is sampled.

Referring to FIGS. 15A, 15B, 16A, 16B, 17A, and 17B, the driving time of the second subpixel SP2 may include a second initialization time Tinit2 in which the reference voltage Vref is applied to the second reference voltage line RVL2, a second tracking time Ttrack2 in which the voltage of the second reference voltage line RVL2 increases from the reference voltage Vref and then is saturated, and a second sampling time Tsam2 in which the voltage of the second reference voltage line RVL2 is sampled.

Referring to FIGS. 15A, 15B, 16A, 16B, 17A, and 17B, in switching control-based sensing control (i.e., sensing driving timing control) according to embodiments, the length of the first tracking time Ttrack1 may be longer than the length of the second tracking time Ttrack2.

The switching control-based sensing control (i.e., sensing driving timing control) according to embodiments may include at least one of an initialization split control method and a sampling split control method.

The initialization split control method is a method of splitting an initialization operation of the first subpixel SP1 and an initialization operation of the second subpixel SP2. According to the initialization split control method, the switching operation of the first power switch SPRE1 and the switching operation of the second power switch SPRE2 may be controlled independently.

The sampling split control method is a method of splitting a sampling operation of the first subpixel SP1 and a sampling operation of the second subpixel SP2. According to the sampling split control method, the switching operation of the first sampling switch SAM1 and the switching operation of the second sampling switch SAM2 may be controlled independently.

Referring to FIGS. 15A, 15B, 16A, and 16B, when the switching control-based sensing control (i.e., sensing driving timing control) according to embodiments is the initialization split control method, the end point of the first initialization time Tinit1 may be earlier than the end point of the second initialization time Tinit2.

Here, the end point of the first initialization time Tinit1 may match the start point of the first tracking time Ttrack1, whereas the end point of the second initialization time Tinit2 may match the start point of the second tracking time Ttrack2.

According to the initialization split control method, in the data driving circuit 120, a point in time (i.e., the start point of the first tracking time Ttrack1) at which the voltage of the first sensing channel terminal ST1 starts to increase from the reference voltage Vref may be earlier than a point in time (i.e., the start point of the second tracking time Ttrack2) at which the voltage of the second sensing channel terminal ST2 starts to increase from the reference voltage Vref.

Figure 17A:
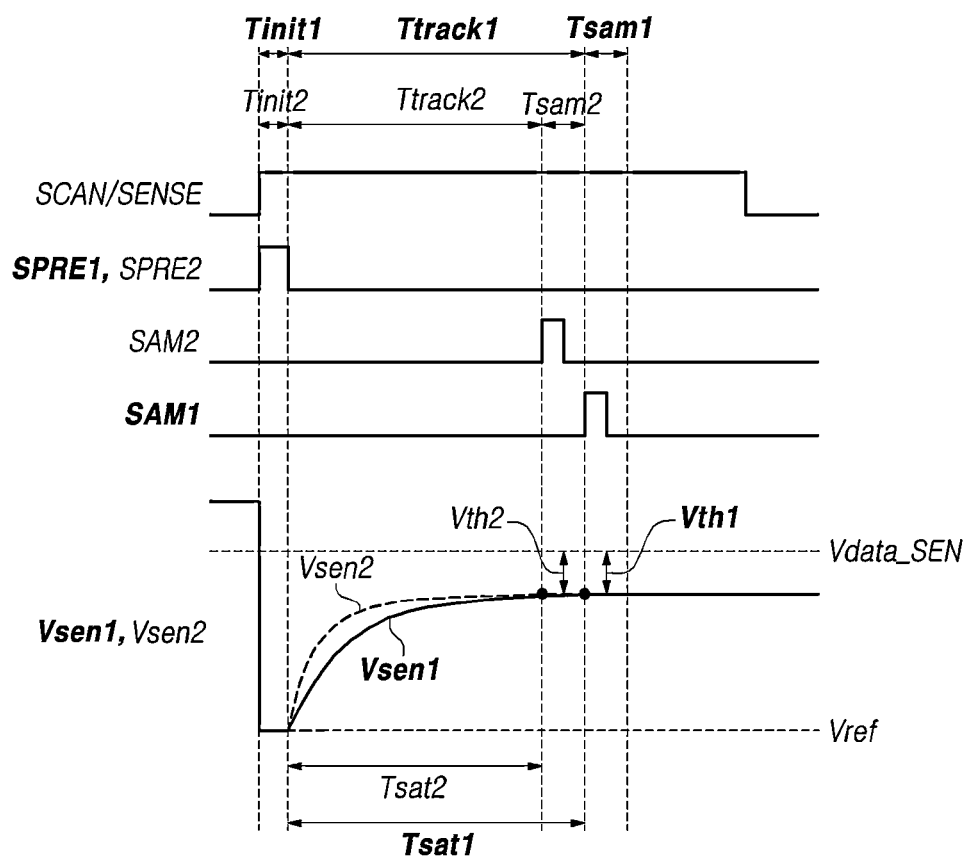
FIGS. 17A and 17B illustrate sensing driving timing diagrams for a first subpixel and a second subpixel on the basis of the sampling split control in the display device according to embodiments.
Figure 17B:
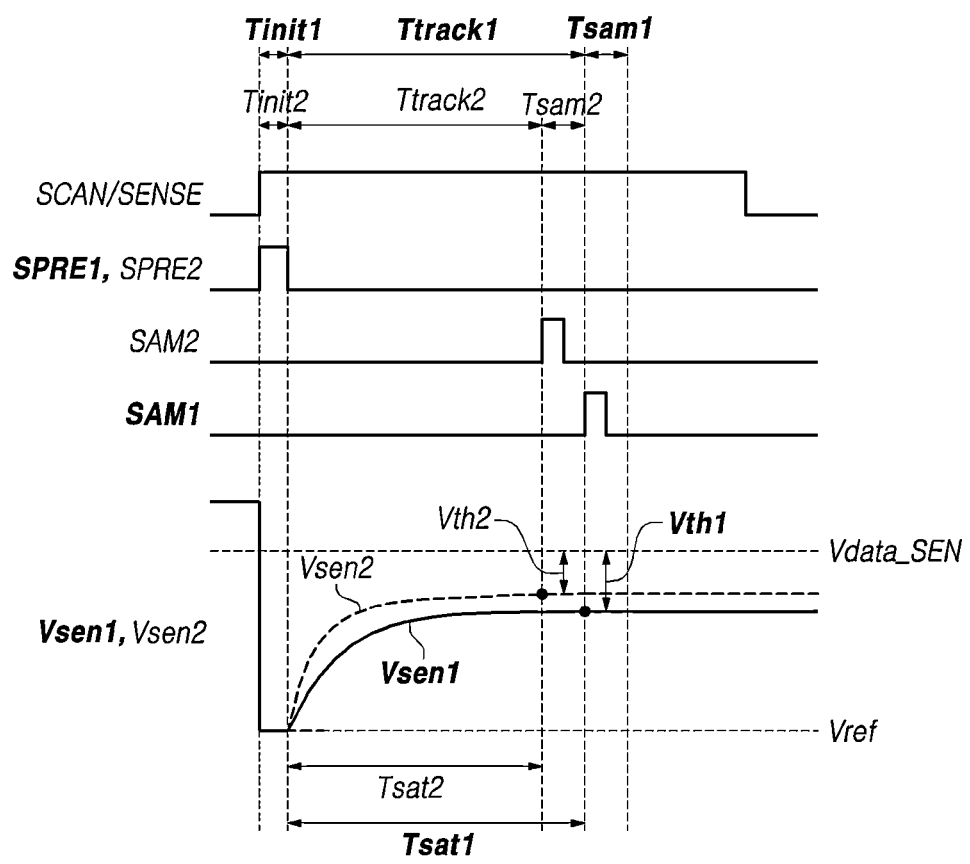

Referring to FIGS. 17A and 17B, when the switching control-based sensing control (i.e., sensing driving timing control) according to embodiments is the sampling split control method, the end point of the first tracking time Ttrack1 may be later than the end point of the second tracking time Ttrack2.

Here, the end point of the first tracking time Ttrack1 may match the start point of the first sampling time Tsam1, and the end point of the second tracking time Ttrack2 may match the start point of the second sampling time Tsam2.

According to the sampling split control method, in the data driving circuit 120, a point in time at which the voltage of the first sensing channel terminal ST1 is saturated may be later than a point in time at which the voltage of the second sensing channel terminal ST2 is saturated.

The point in time at which the voltage of the first sensing channel terminal ST1 is saturated may be a point in time at which the first saturation time Tsat1 has been passed after the start point of the first tracking time Ttrack1.

The first saturation time Tsat1 is a time taken for the voltage of the first reference voltage line RVL1 to be saturated. The start point of the first sampling time Tsam1 is required to be an end point (i.e., a saturation point) of the first saturation time Tsat1 or a subsequent point in time.

The point in time at which the voltage of the second sensing channel terminal ST2 is saturated may be a point in time at which the second saturation time Tsat2 has been passed after the start point of the second tracking time Ttrack2.

The second saturation time Tsat2 is a time taken for the voltage of the second reference voltage line RVL2 to be saturated. The start point of the second sampling time Tsam2 is required to be an end point (i.e., a saturation point) of the second saturation time Tsat1 or a subsequent point in time.

In the driving timing diagrams illustrated in FIGS. 15A, 15B, 16A, 16B, 17A, and 17B, in the sensing driving of the first subpixel SP1, the voltage on the second node N2 of the driving transistor DRT in the first subpixel SP1 may be the same as or similar to the voltage Vsen1 of the first reference voltage line RVL1 electrically connected to the second node N2 of the driving transistor DRT through the sensing transistor SENT. In addition, in the sensing driving of the second subpixel SP2, the voltage on the second node N2 of the driving transistor DRT in the second subpixel SP2 may be the same as or similar to the voltage Vsen2 of the second reference voltage line RVL2 electrically connected to the second node N2 of the driving transistor DRT through the sensing transistor SENT.

Figure 15A:
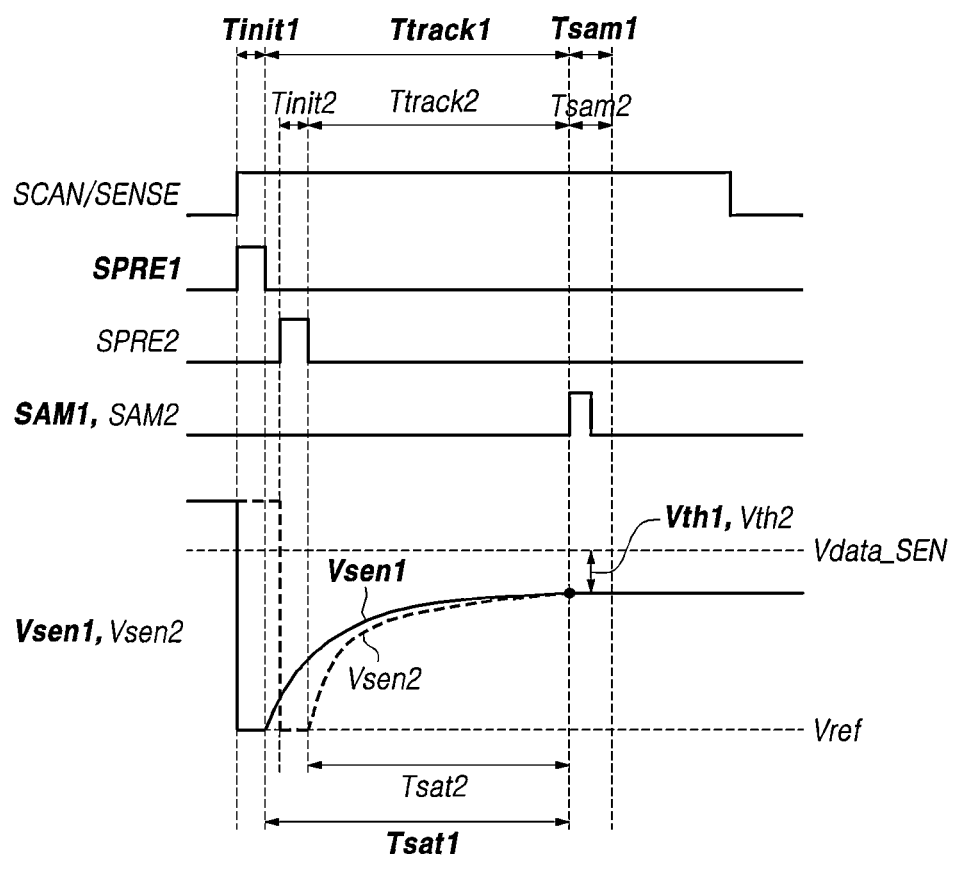
FIGS. 15A and 15B are diagrams illustrating the sensing driving timing of a first subpixel and a second subpixel on the basis of the initialization split control in the display device according to embodiments.
Figure 15B:
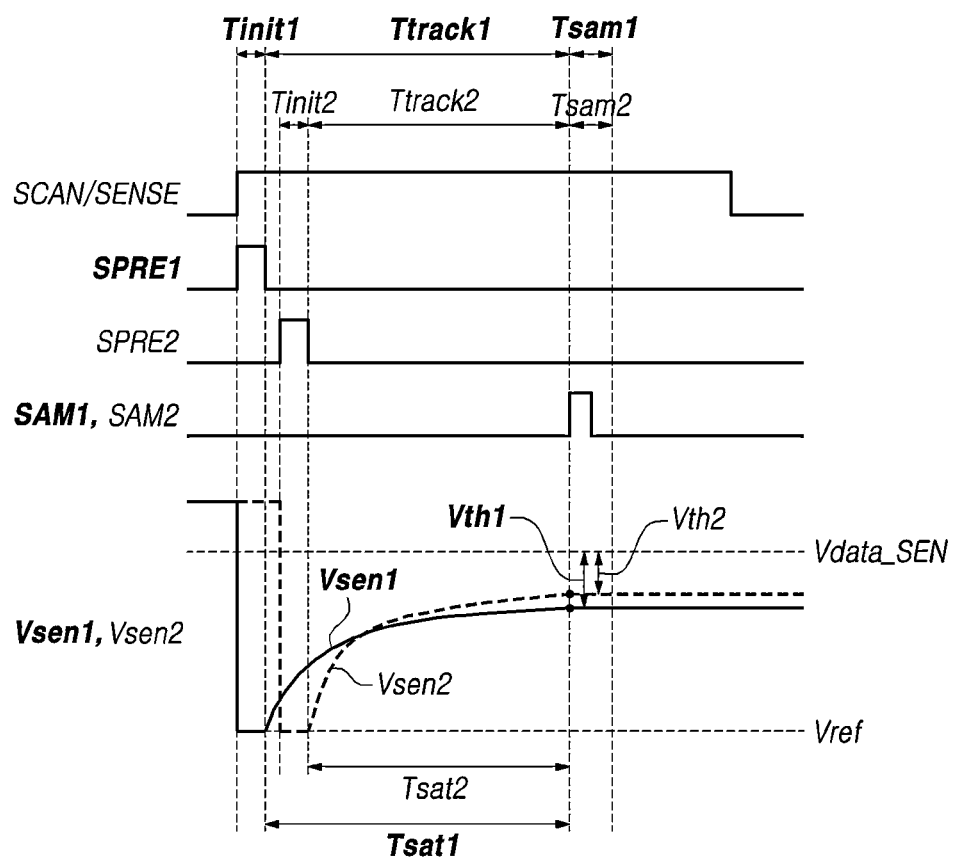

FIGS. 15A and 15B are diagrams illustrating the sensing driving timing of the first subpixel SP1 and the second subpixel SP2 on the basis of the initialization split control in the display device 100 according to embodiments.

The driving timing diagrams illustrated in FIGS. 15A and 15B are based on an assumption that each the threshold voltage Vth1 of the driving transistor DRT in the first subpixel SP1 and the threshold voltage Vth2 of the driving transistor DRT in the second subpixel SP2 is a positive threshold voltage Positive Vth.

The driving timing diagram illustrated in FIG. 15A is based on an assumption that the threshold voltage Vth1 of the driving transistor DRT in the first subpixel SP1 and the threshold voltage of the driving transistor DRT in the second subpixel SP2 are the same.

The driving timing diagram illustrated in FIG. 15B is based on an assumption that the threshold voltage Vth1 of the driving transistor DRT in the first subpixel SP1 is higher than the threshold voltage Vth2 of the driving transistor DRT in the second subpixel SP2.

Referring to FIGS. 15A and 15B, in the initialization split control method, the initialization operation in the sensing driving time for the first subpixel SP1 and the initialization operation in the sensing driving time for the second subpixel SP2 may be performed independently. In this regard, the switching operation of the first power switch SPRE1 and the switching operation of the second power switch SPRE2 may be performed independently.

Referring to FIGS. 15A and 15B, according to the initialization split control method, the length of the first initialization time Tinit1 may be the same as the length of the second initialization time Tinit2. Alternatively, the length of the first initialization time Tinit1 may be set differently from the length of the second initialization time Tinit2 depending on a minimum time required for the initialization of the voltage of each of the first reference voltage line RVL1 and the second reference voltage line RVL2.

Referring to FIGS. 15A and 15B, according to the initialization split control method, the start point of the first initialization time Tinit1 may be earlier than the start point of the second initialization time Tinit2.

Referring to FIGS. 15A and 15B, according to the initialization split control method, the start point of the first tracking time Ttrack1 may be earlier than the start point of the second tracking time Ttrack2. The start point of the first tracking time Ttrack1 may be the same as the end point of the first initialization time Tinit1, and be referred to as a point in time at which the voltage of the first reference voltage line RVL1 starts to increase. The start point of the second tracking time Ttrack2 may be the same as the end point of the second initialization time Tinit2, and be referred to as a point in time at which the voltage of the second reference voltage line RVL2 starts to increase.

Referring to FIGS. 15A and 15B, according to the initialization split control method, the start point of the first sampling time Tsam1 may be the same as the start point of the second sampling time Tsam2.

The start point of the first sampling time Tsam1 may be the same as the end point of the first tracking time Ttrack1, and be a point in time at which the voltage of the first reference voltage line RVL1 is saturated after having increased or a subsequent point in time.

Referring to FIGS. 15A and 15B, the turn-on point in time of the first power switch SPRE1 may be earlier than the turn-on point in time of the second power switch SPRE2. The turn-off point in time of the first power switch SPRE1 may be earlier than the turn-off point in time of the second power switch SPRE2.

However, the turn-on point in time of the first sampling switch SAM1 may be the same as the turn-on point in time of the second sampling switch SAM2

Figure 16A:
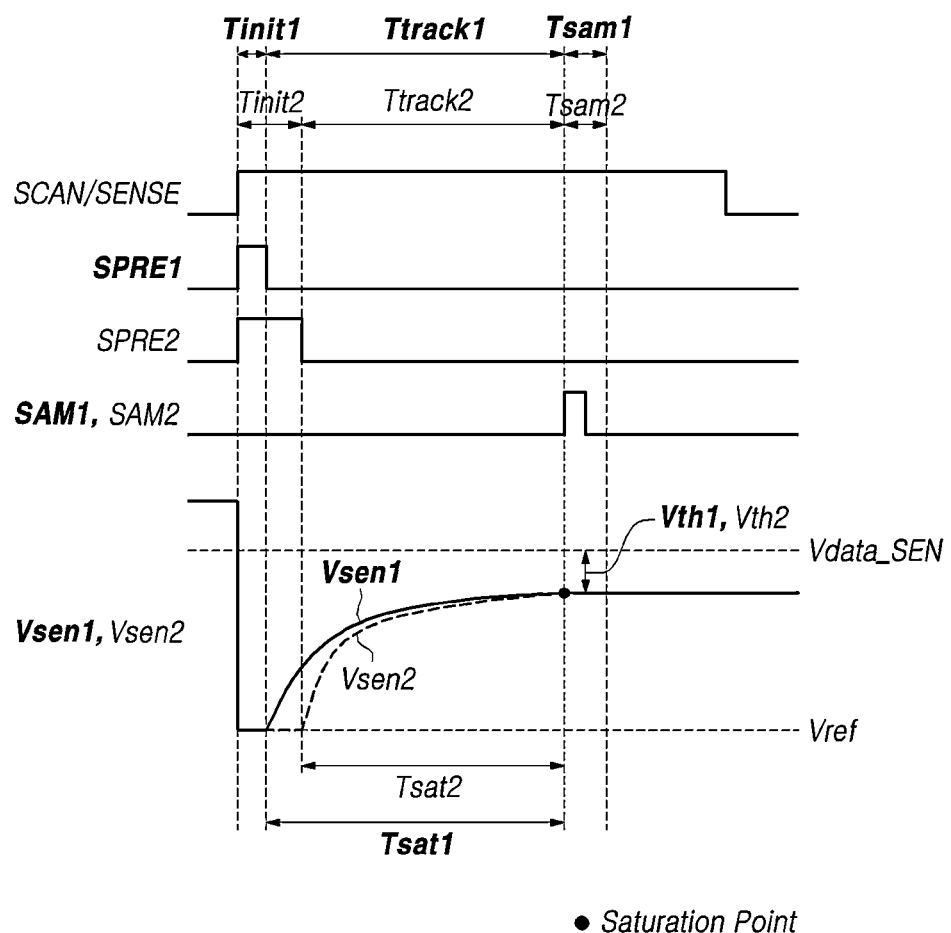
FIGS. 16A and 16B illustrate other sensing driving timing diagrams for a first subpixel and a second subpixel on the basis of the initialization split control in the display device according to embodiments.
Figure 16B:
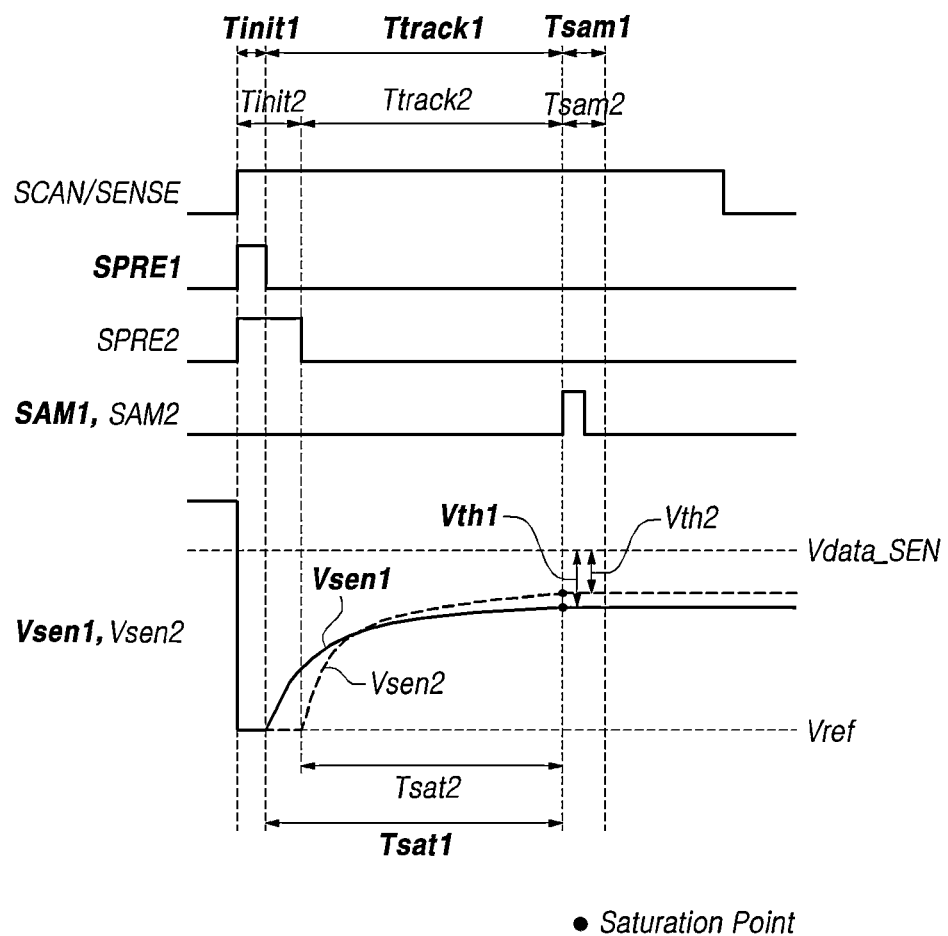

FIGS. 16A and 16B illustrate other sensing driving timing diagrams for the first subpixel SP1 and the second subpixel SP2 on the basis of the initialization split control in the display device 100 according to embodiments.

The driving timing diagram illustrated in FIGS. 16A and 16B the substantially the same as the driving timing diagram illustrated in FIGS. 15A and 15B. Here, the turn-on point in time of the second power switch SPRE2 in FIGS. 16A and 16B is earlier than the turn-on point in time of the second power switch SPRE2 in FIGS. 15A and 15B.

Referring to FIGS. 16A and 16B, according to the initialization split control method, the length of the first initialization time Tinit1 may be shorter than the length of the second initialization time Tinit2.

Referring to FIGS. 16A and 16B, according to the initialization split control method, the start point of the first initialization time Tinit1 may be the same as the start point of the second initialization time Tinit2.

Referring to FIGS. 16A and 16B, according to the initialization split control method, the end point of the first initialization time Tinit1 may be earlier than the end point of the second initialization time Tinit2. Thus, the start point of the first tracking time Ttrack1 may be earlier than the start point of the second tracking time Ttrack2.

Referring to FIGS. 16A and 16B, according to the initialization split control method, the start point of the first sampling time Tsam1 may be the same as the start point of the second sampling time Tsam2.

Referring to FIGS. 16A and 16B, according to the initialization split control method, the turn-on point in time of the first power switch SPRE1 may be the same as the turn-on point in time of the second power switch SPRE2.

Referring to FIGS. 16A and 16B, according to the initialization split control method, the turn-off point in time of the first power switch SPRE1 may be earlier than the turn-off point in time of the second power switch SPRE2. The turn-on point in time of the first sampling switch SAM1 may be the same as the turn-on point in time of the second sampling switch SAM2.

However, the turn-on point in time of the first sampling switch SAM1 may be the same as the turn-on point in time of the second sampling switch SAM2.

As illustrated in FIGS. 15A, 15B, 16A, and 16B, when the sensing driving timing is controlled by the initialization split control method, the length of the first tracking time Ttrack1 may be longer than the length of the second tracking time Ttrack2, and the first tracking time Ttrack1 may start earlier than the second tracking time Ttrack2.

Thus, the voltage on the second node N2 of the driving transistor DRT in the first subpixel SP1 may start to increase earlier and continue to increase for a longer time than the voltage on the second node N2 of the driving transistor DRT in second subpixel SP2.

However, since the driving transistor DRT in the first subpixel SP1 has a smaller channel size than the driving transistor DRT in the second subpixel SP2, the voltage rise rate of the second node N2 of the driving transistor DRT in the first subpixel SP1 may be lower than the voltage rise rate of the second node N2 of the driving transistor DRT in the second subpixel SP2.

Thus, the first saturation time Tsat1 taken for the voltage on the second node N2 of the driving transistor DRT in the first subpixel SP1 to be saturated may be longer than the second saturation time Tsat2 taken for the voltage on the second node N2 of the driving transistor DRT in the second subpixel SP2 to be saturated.

As described above, although the voltage on the second node N2 of the driving transistor DRT in first subpixel SP1 starts to increase earlier and continues to increase for a longer time than the voltage on the second node N2 of the driving transistor DRT in the second subpixel SP2, the voltage on the second node N2 of the driving transistor DRT in the first subpixel SP1 and the voltage on the second node N2 of the driving transistor DRT in the second subpixel SP2 may be saturated at the same point in time.

In the sensing driving of the first and second subpixels SP1 and SP2 having different saturation times Tsat1 and Tsat2, simultaneous sampling may be possible. Thus, sampling control may be facilitated, and the data driving circuit 120 may provide sensing values of the first and second subpixels SP1 and SP2 to the controller 140 at the same time. Consequently, the controller 140 can generate compensation values for the first and second subpixels SP1 and SP2 at the same time using the sensing values of the first and second subpixels SP1 and SP2, thereby improving compensation efficiency.

The control may be performed so that the first tracking time Ttrack1 for the first subpixel SP1 starts earlier. In this case, the tracking operation (i.e., threshold voltage tracking operation) for the first subpixel SP1 requiring a longer saturation time Tsat1 may end at an earlier point in time. Thus, the tracking operation (i.e., threshold voltage tracking operation) for the first subpixel SP1 may end together with the tracking operation (i.e., threshold voltage tracking operation) for the second subpixel SP2.

Since the sensing driving timing is controlled by the initialization split control method, the sensing driving of the first subpixel SP1 having the more extended sensing time, of the first subpixel SP1 and the second subpixel SP2, may be reduced to end earlier. Thus, the sensing of both the first subpixel SP1 and the second subpixel SP2 may be completed earlier.

FIGS. 17A and 17B illustrate sensing driving timing diagrams for the first subpixel SP1 and the second subpixel SP2 on the basis of the sampling split control in the display device 100 according to embodiments.

The driving timing diagram illustrated in FIGS. 17A and 17B are based on an assumption that each of the threshold voltage Vth1 of the driving transistor DRT in the first subpixel SP1 and the threshold voltage Vth2 of the driving transistor DRT in the second subpixel SP2 is a positive threshold voltage Positive Vth.

The driving timing diagram illustrated in FIG. 17A is based on an assumption that the threshold voltage Vth1 of the driving transistor DRT in the first subpixel SP1 and the threshold voltage Vth2 of the driving transistor DRT in the second subpixel SP2 are the same.

The driving timing diagram illustrated in FIG. 17B is based on an assumption that the driving transistor DRT1 threshold voltage Vth1 in the first subpixel SP1 is higher than the threshold voltage Vth2 of the driving transistor DRT in the second subpixel SP2.

Referring to FIGS. 17A and 17B, in the sampling split control method, the sampling operation in the sensing driving time for the first subpixel SP1 and the sampling operation in the sensing driving time for the second subpixel SP2 may be performed independently. In this regard, the switching operation of the first sampling switch SAM1 and the switching operation of the second sampling switch SAM2 may be performed independently.

Referring to FIGS. 17A and 17B, according to the sampling split control method, the start point of the first tracking time Ttrack1 may be the same as the start point of the second tracking time Ttrack2. The end point of the first tracking time Ttrack1 may be later than the end point of the second tracking time Ttrack2.

That is, the tracking operation in the sensing driving of the first subpixel SP1 may be performed for a longer time than the tracking operation in the sensing driving of the second subpixel SP2. This is because the first saturation time Tsat1 taken for the voltage on the second node N2 of the driving transistor DRT in the first subpixel SP1 to be saturated is longer than the second saturation time Tsat2 taken for the voltage on the second node N2 of the driving transistor DRT in the second subpixel SP2 to be saturated.

Referring to FIGS. 17A and 17B, according to the sampling split control method, the turn-on point in time of the first sampling switch SAM1 may be later than the turn-on point in time of the second sampling switch SAM2.

Referring to FIGS. 17A and 17B, the turn-off point in time of the first power switch SPRE1 may be the same as the turn-off point in time of the second power switch SPRE2.

According to embodiments as set forth above, the display device 100 and the driving circuit can reduce sensing time.

According to embodiments, the display device 100 and the driving circuit can reduce sensing times for subpixels having different channel sizes.

According to embodiments, the display device 100 and the driving circuit can improve compensation efficiency by simultaneously stopping sensing driving of subpixels having different sensing times.

According to embodiments, the display device 100 and the driving circuit have a sensing time reducing function applicable even in double-rate driving.

It will be apparent to those skilled in the art that various modifications and variations can be made in the display device and the driving circuit of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
a first data line and a second data line;
a first reference voltage line and a second reference voltage line;
a first subpixel connected to the first data line and the first reference voltage line, and comprising an emitting device and a driving transistor; and
a second subpixel connected to the second data line and the second reference voltage line, and comprising an emitting device and a driving transistor,
wherein:
a driving time of the first subpixel includes a first initialization time in which a reference voltage is applied to the first reference voltage line and a first tracking time in which a voltage of the first reference voltage line increases from the reference voltage and then is saturated;
a driving time of the second subpixel includes a second initialization time in which the reference voltage is applied to the second reference voltage line and a second tracking time in which a voltage of the second reference voltage line increases from the reference voltage and then is saturated;
a start point of the first initialization time is earlier than or same as a start point of the second initialization time, and an end point of the first initialization time is earlier than an end point of the second initialization time;
a length of the first tracking time is longer than a length of the second tracking time; and
a start point of the first tracking time is earlier than a start point of the second tracking time, and an end point of the first tracking time is same as an end point of the second tracking time.

2. The display device of claim 1, wherein a channel size of the driving transistor included in the first subpixel is equal to or smaller than a channel size of the driving transistor included in the second subpixel.

3. The display device of claim 1, wherein the start point of the first initialization time is earlier than the start point of the second initialization time.

4. The display device of claim 1, wherein the start point of the first initialization time is the same as the start point of the second initialization time.

5. The display device of claim 1, wherein the first subpixel is configured to emit light having a first color, and the second subpixel is configured to emit light having a second color different from the first color.

6. The display device of claim 5, wherein the driving time of the first subpixel and the driving time of the second subpixel overlap in time.

7. The display device of claim 1, wherein no other subpixel is disposed between the first subpixel and the first reference voltage line, a third subpixel is disposed between the second subpixel and the second reference voltage line, and the third subpixel is connected to the second reference voltage line.

8. The display device of claim 7, wherein a channel size of the driving transistor included in the third subpixel is equal to or smaller than a channel size of the driving transistor included in the second subpixel.

9. The display device of claim 1, wherein a fourth subpixel is disposed between the first subpixel and the second subpixel, and
the fourth subpixel is connected to the first reference voltage line.

10. The display device of claim 9, wherein a channel size of the driving transistor included in the fourth subpixel is equal to or greater than a channel size of the driving transistor included in the first subpixel.

11. The display device of claim 1, further comprising:
a measuring circuit configured to measure a voltage of each of the first reference voltage line and the second reference voltage line;
a first power switch configured to switch a connection between the first reference voltage line and a reference voltage application node;
a first sampling switch configured to switch a connection between the first reference voltage line and the measuring circuit;

a second power switch configured to switch a connection between the second reference voltage line and the reference voltage application node; and a second sampling switch configured to switch a connection between the second reference voltage line and the measuring circuit.

12. The display device of claim 11, wherein a turn-on point in time of the first power switch is earlier than a turn-on point in time of the second power switch, and a turn-off point in time of the first power switch is earlier than a turn-off point in time the second power switch, and a turn-on point in time of the first sampling switch is the same as a turn-on point in time of the second sampling switch.

13. The display device of claim 11, wherein a turn-on point in time of the first power switch is same as a turn-on point in time of the second power switch, and a turn-off point in time of the first power switch is earlier than a turn-off point in time of the second power switch, and the turn-on point in time of the first sampling switch is same as the turn-on point in time of the second sampling switch.

14. A driving circuit, comprising:
a first data channel terminal electrically connected to a first data line;
a second data channel terminal electrically connected to a second data line;
a first sensing channel terminal electrically connected to a first reference voltage line;
a second sensing channel terminal electrically connected to a second reference voltage line; and
a data signal provider configured to output a first data signal to the first data channel terminal and a second data signal to the second data channel terminal,
wherein a point in time at which a voltage of the first sensing channel terminal starts to increase from a reference voltage is earlier than a point in time at which a voltage of the second sensing channel terminal starts to increase from the reference voltage, or
a point in time at which the voltage of the first sensing channel terminal is saturated is later than a point in time at which the voltage of the second sensing channel terminal is saturated, and
wherein the first data channel terminal is electrically connected in common to a data line different from the first data line, and the second data channel terminal is electrically connected in common to a data line different from the second data line.

15. The driving circuit of claim 14, further comprising:
a measuring circuit configured to measure a voltage of each of the first reference voltage line and the second reference voltage line;

a first power switch configured to switch a connection between the first reference voltage line and a reference voltage application node;
a first sampling switch configured to switch a connection between the first reference voltage line and the measuring circuit;
a second power switch configured to switch a connection between the second reference voltage line and the reference voltage application node; and
a second sampling switch configured to switch a connection between the second reference voltage line and the measuring circuit.

16. The driving circuit of claim 14, wherein, in an active period, the first data signal output to the first data line is an image data signal regarding a first color,
in the active period, the second data signal output to the second data line is an image data signal regarding a second color different from the first color, and
after a power-off signal is generated, the first data signal output to the first data line and the second data signal output to the second data line have a same voltage value.

17. A display device, comprising:
a first data line and a second data line;
a first reference voltage line and a second reference voltage line;
a first subpixel connected to the first data line and the first reference voltage line, and comprising an emitting device and a driving transistor; and
a second subpixel connected to the second data line and the second reference voltage line, and comprising an emitting device and a driving transistor,
wherein:
a driving time of the first subpixel includes a first initialization time in which a reference voltage is applied to the first reference voltage line and a first tracking time in which a voltage of the first reference voltage line increases from the reference voltage and then is saturated;
a driving time of the second subpixel includes a second initialization time in which the reference voltage is applied to the second reference voltage line and a second tracking time in which a voltage of the second reference voltage line increases from the reference voltage and then is saturated;
a start point of the first tracking time is earlier than a start point of the second tracking time or an end point of the first tracking time is later than an end point of the second tracking time; and
the driving time of the first subpixel and the driving time of the second subpixel do not overlap in time.

* * * * *